(12) United States Patent
Miljkovic et al.

(10) Patent No.: US 11,692,271 B2
(45) Date of Patent: Jul. 4, 2023

(54) IMMERSION COOLING WITH WATER-BASED FLUID USING NANO-STRUCTURED COATING

(71) Applicant: Board of Trustees of the University of Illinois, Urbana, IL (US)

(72) Inventors: Nenad Miljkovic, Urbana, IL (US); Thomas Foulkes, Terre Haute, IN (US); Patrick Birbarah, Lacrosse, WI (US); Tarek Gebrael, Champaign, IL (US); Andrew Stillwell, Champaign, IL (US); Robert Pilawa-Podgurski, Alameda, CA (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 16/948,858

(22) Filed: Oct. 2, 2020

(65) Prior Publication Data

US 2021/0102294 A1   Apr. 8, 2021

Related U.S. Application Data

(60) Provisional application No. 62/910,365, filed on Oct. 3, 2019.

(51) Int. Cl.
  *C23C 16/56* (2006.01)
  *C23C 16/46* (2006.01)
  *H01L 21/02* (2006.01)
  *C23C 16/40* (2006.01)

(52) U.S. Cl.
  CPC ............ *C23C 16/56* (2013.01); *C23C 16/401* (2013.01); *C23C 16/463* (2013.01); *H01L 21/02126* (2013.01); *H01L 21/02203* (2013.01); *H01L 21/02271* (2013.01)

(58) Field of Classification Search
  None
  See application file for complete search history.

(56) References Cited

U.S. PATENT DOCUMENTS

| 2010/0129639 A1* | 5/2010 | Icoz ..................... B01B 1/06 977/773 |
| 2011/0174069 A1* | 7/2011 | Cornelius ............... B22F 3/002 977/890 |
| 2012/0270129 A1* | 10/2012 | Marinho ........... B01D 19/0409 136/246 |
| 2015/0022975 A1* | 1/2015 | Browne ............. H05K 7/20309 361/700 |

(Continued)

OTHER PUBLICATIONS

Chen, Nano Lett., vol. 9, No. 2, 2009 (Year: 2009).*

(Continued)

*Primary Examiner* — Joel G Horning
(74) *Attorney, Agent, or Firm* — Lowenstein Sandler LLP

(57) ABSTRACT

A method includes coating, via chemical vapor deposition, electronics disposed on a printed circuit board (PCB) with an electrical insulation coating of between one micron to 25 microns. The method further include depositing, on the electrical insulation coating, a metallic nano-layer comprising a porous metallic nano-structure. The method further includes, after the coating and the depositing, immersing the PCB in a water-based fluid to cool the electronics while the electronics are powered on.

9 Claims, 16 Drawing Sheets

(56) References Cited

U.S. PATENT DOCUMENTS

2021/0013126 A1* 1/2021 Joshi ............... H01L 24/32

OTHER PUBLICATIONS

Yang, Y. et al., CVD Growith Kinetics of HfB2 Thin Films from the Single-Source Precursor Hf (BH4) 4, Chem Mater. 18 (21) (2006), pp. 5088-5096.
Yokouchi, K. et al., "Immersion Cooling for High-Density Packaging," IEEE Transactions on Components Hybrids and Manufacturing Technology, 1987, 10(4), pp. 643-646.
Zhang, H. et al., "Free Cooling of Data Centers," A Review, Renew, Sustain. Energy Rev. 35 (2014), pp. 171-182.
Zhu, L. et al., "Water Immersion Cooling of PV Cellsin a High Concentration System," Sol. Energy Mater. Sol. Cells 95 (2) (2011), pp. 538-545.
Chen, X.Y. et al., "Direct Liquid Cooling of a Stacked Multichip Module," IEEE Electonics Packaging Technology Conference, pp. 380-384, 2002.
Pamuk, T., "Natural Convection Immersion Cooling of an Array of Simulated Chips in an Enclosure Filled with Dielectric Liquid," Department of the Navy, Naval Postgraduate School, Monterey, California, Thesis, 75 pages, Dec. 1987.
Bar-Cohen, A. et al., "Direct Liquid Cooling of High Flux Micro and Nano Electronic Components," IEEE, Proceedings of the IEEE, vol. 94, No. 8, pp. 1549-1570, Aug. 2006.
Ma, C.F., "Impingement Heat Transfer with Meso-Scale Fluid Jets," MOE Key Laboratory of Enhanced Heat Transfer and Energy Conservation, and Beijing Key Laboratory of Heat Transfer and Energy Conversion, College of Environmental and Energy Engineering, Beijing University of Technology, Beijing, 100124, China, 11 pages, 2002.
Liu, Y. et al., "2.5-Dimensional Parylene C Micropore Array with a Large Area and a High Porosity for High-Throughput Particel and Cell Separation," Microsystems & Nanoengineering (2018), 4:13, DOI 10.1038/s41378-0018-0011-8, 12 pages.
Birbarah, P. et al., "Water Immersion Cooling of High Power Density Electronics," International Journal of Heat and Mass Transfer 147 (2020) 118918, Accepted Oct. 17, 2019, 13 pages.
3 M, "3M Novec 7300 Engineered Fluid," copyrighted 2009, 4 pages.
3M, "3M Novec 72DE Engineered Fluid," copyrighted 2009, 4 pages.
3M, "Cool Under Fire—Dielectric Heat Transfer Fluid Solutions for Military and Aerospace Applications," copyrighted 2008, 8 pages.
3M, "Heat Transfer Applications Using 3M Novec Engineering Fluids," copyrighted 2016, 2 pages.
Abelson, J.R., "Ultra-Conformal CVD at Low Temperatures: The Role of Site Blocking and the Use of Growth Inhibitors," Atomic Layer Depos. Applic 6 33 (2) (2010), pp. 307-319.
Adam, J., "New Correlations Between Eelctrical Current and temperature Ris in PCB Traces," Twentieth Annual IEEE Semiconductor Thermal Measurement and Management Symposum, IEEE Cat. No. 04CH37545, 2004.
Arik, M. et al., "Immersion Cooling of Light Emitting Diodes," 2010 12th IEEE Conference on Thermal and Thermonechanical Phenomena in Electronic Systems, 2010.
Baker, E., "Liquid Immersion Cooling of Small Electronic Devices," Microelectron. Reliab. 12 (2) (1973), pp. 163-173.
Barnes, C.M. et al., "Practical Consideration of Immersion Cooling of Power Electronics in Traction Systems," IEEE Transaction on Power Electronics, 2010, 25(9), pp. 2478-2485.
Barth, C. et al., "Design and Control of a GaN-based, 13-Level, Flying Capacitor Multilevel Inverter," in 2016 IEEE 17th Workshop on Control and Modeling for Power Electronics (COMPEL), 2016, Trondheim, Norway.
Baxamusa, S.H. et al., "Thin Polymer Films with High Step Coverage in Microtrenches by Initiated CVD," Chem. Vap. Depos. 14 (9-10) (2008), pp. 313-318.

Bilal, K. et al., "Potentials, Trends, and Prospects in Edge Technologies: Fog, Cloudlet, Mobile Edge, and Micro Data Centers," Comput. Netw. 130 (2018), pp. 94-120.
Bohne, D., et al.,"Thermal-Conductivity, Density, Viscosity and Prandtl-numbers of ethylene glycol-water Mixtures," betichte der bunsen-gesellschaft-physical Chemistry, Chem. Phys 88 (8) 1984), pp. 739-742.
Chang, J.Y. et al., "Enhanced Boiling Heat Transfer from Microporous Surfaces: Effects of a Coating Composition and Method," Int. J. Heat Mass Transf. 40 (18) (1997), pp. 4449-4460.
Chen, T.L. et al., "Measurement and High-Speed Visualization of Flow Boiling of a Dielectric Fluid in a Silicon Microchannel Heat Sink," Int. J. Multiph. Flow 32 (3) (2006), pp. 957-971.
Cho, H.J. et al., "Nanoengineered Materials for Liquid-Vapour Phase-Change heat Transfer," Nat. Rev. Mater. 2 (2) (2017), p. 16092.
Chu, K.H. et al., "Enhanced Boiling Heat Transfer with Copper Oxide Hierarchical Surfaces," Transducers, 2013, Barcelona, Spain.
Chu, K.H. et al., Structured Surfaces for Enhanced Pool Boiling Heat Transfer, Appl. Phys. Lett. 100 (24) (2012).
Ebrahimi, K. et al., "A Review of Data Centert Cooling Technology, Operating Conditions and the Corresponding Low-Grade Waste Heat Recovery Opportunities," Renew Sustain. Energy Rev 31 (2014), pp. 622-638.
Egorov, G.I. et al., "Volumetric Properties of the Water-Ethylene Glycol Mixtures in the Temperature Range 278-333.15 K at Atmospheric Pressure," Russ J. Gen. Chem. 80 (8) (2010), pp. 1577-1585.
Enright, R. et al., "Dropwise Condensation on Mcro- and Nanostructured Surfaces," Nanoscale Microscale Thermophys. Eng. 18 (3) (2014), pp. 223-250.
Foulkes, T. et al., "Self-Assembled Liquid Bridge Confined Boiling on Nanoengineered Surfaces," Int. J. Heat Mass Transf. 133 (2019), pp. 1154-1164.
GaN Systems, "GS66508B 650 V Enhancement Mode GaN Transistor," retreived from https://gansystem.com/gan-transistors/gs65508b/, on Jan. 8, 2021, 5 pages.
GaN Systems, "GS66508T 650V Enhancment Mode GaN Transistor," retrieved from https://gansystems.com/gan-transistors/gs66508t/, on Jan. 8, 2021, 5 pages.
Garimella, S. et al., "Technological Drivers in Data Centers and Telcom Systems: Multiusscale Thermal, Electrical and Energy Management," Applied Energy, vol. 107, 2013.
George, S.M. et al., "Atomic Layer Deposistion for Continuous Roll-to-Roll Processing," 54th Technical Conference Proceedings of the Society of Vacuum Coaters (SVC), 2011.
Heaney, M. "Electrical Conductivity and Resistivity," Electrical Measurement, Signal Processing, and Displays, Ed. John G. Webster, CRC Press, 2003, pp. 7-1-7-14.
Jouppi, N.P. et al., "In-Datacenter Performance Analysis of a Tensor Processing Unit," 2017 ACM/IEEE 44th Annual International Symposium on Computer Architecture (ISCA), 2017.
Khalaj, A. et al., "A Review of Effiecient Thermal Management of Air- and Liquid-Cooled and Data Centers: From Chip to Cooling System," Applied Energy vol. 205, 2017.
Lei, Y.T., et al., "A 2-kw Single-Phase Seven-Level Flying Capacitor Multilevel Inverter with an Active Energy Buffer," IEEE Trans. Power Electron, 32 (11) (2017), pp. 8570-8581.
Marto, P.J. et al., "Pool Boiling Heat-Transfer from Enhanced Surface to Dielectric Fluids," J. Heat Transf-Trans. ASME 104(2) (1982), pp. 292-299.
Meynard, T.A. et al., "Multicell Converters: Basic Concepts and Industry Applications," IEEE Trans. Ind. Electron 49 (5) (2002), pp. 955-964.
Modeer, T. et al., Design of a GaN-based, 9-Level Flying Capacitor Multilevel Inverter with Low Inductance Layout, in Thirty Second Annual IEEE Applied Power Electronics Conferenece and Expostition (Apec), 2017, pp. 2582-2589.
Moore, A.L et al., "Emerging Challenges and Materials for Thermal Management fo Electronics," Mater, Today 17 (4), (2014), pp. 163-174.
Narumanchi, S., "Thermal Interface Materials for Power Electronics Applications," in Itherm. 2008: Orlando, FL, USA.

(56) References Cited

OTHER PUBLICATIONS

Pallo, N. et al., "Power-Dense Multilevel Inverter Module using Interleaved GaN-Based Phases for Electric Aircraft Propulsion," IEE Applied Power Electronics Conference and Exposition (APEC), 2018, San Antonio TX, USA.

Prasher, R., "Thermal Interface Materials: Historical Perpsective, Status, and Furture Directions," Proceeding of the IEEE, 94(8), 2006.

Qu, W.L., et al., "Measurement and Prediction of Pressure Drop in Two-Phase Micro-Channel Heat Sinks," Int. J. Heat Mass Transf. 46 (15) (2003), pp. 2737-253.

Rausch, M.H. et al., "Density, Surface tension, and Kinematic Viscosity of Hydrofluoroethers HFE-7000, HFE-7100, HFE-7200, HFE, 7300, and HFE-7500," J. Chem Eng. Data 60 (12) (2015), pp. 3759-3765.

Rose, J.W., Dropwise Condensation Theory, and Experiment: A Review, Proceeding of the Institution of Mechanical Engineers Part a—Journal of Power and Energy, 2002, pp. 115-128.

Sarvar, F. et al., "Thermal Interface Materials—A Review of the of the State of the Art," in Electronics System Integration Technology Conference, 1st. IEEE 2006: Dresden, Germany.

Saylor, J.R. et al., "Fluid Selection and Property Effects in Single-Phase and 2-Phase Immersion Cooling," IEEE Trans. on Comp Hybrids & Manufacturing Techlology, 1988, 11(4), pp. 557-565.

SCS, Specialty Coating Sytems, "SCS Parylene Properties," copyrighted 2021, 2 pages.

Anandan, S.S., et al., "Thermal Management of Electronics: A Review of Literature," Therm. Sci. 12 (2) (2008), pp. 5-26.

Shehabi et al. "United States Data Center Energy Usage Report," Berkeley, CA, Lawrence Berkeley National Laboratory, 2016.

Stillwell, A., et al., "Design of a 1 kV Bidirectional DC-DC Converter with 650 V GaN Transistors," IEEE Applied Power Electronics Conference and Exposition (APEC), 2018: San Antonio, TX, USA.

GaN Systems, "PCB Thermal Design Guide for GaN Enhancement Mode Power Transistors," available from https://www.econal.com/fileadmin/Datenblaetter/GaN_Systems/App_Notes/Gn00t_App_Note_PCB_Thermal_Dsign_Guide_for_GaN_Enhancement_Mode_Power_Transistors.pdf, copyrighted 2009-2015 GaN Systems Inc., GN005 Rev 150212, 15 pages.

Tantolin, C. et al., "Experimental-Study of Immersion Cooling for Power Components," International Conference on Control 94, vols. 1 and 2, 1994, pp. 723-727.

Tsierkezos, N.G. et al., "Thermodynamic Propertis of Water Plus ethylene Glycol at 283.15, 293.15, 303.15, and 313.15 K," J Chem Eng. Data 43 (6) (1998), pp. 989-993.

Kandlikar, S.G. et al., "Extending the Heat Flux Limit with Enhanced Microchannels in Direct Single-Phase Cooling of Computer Chips," Semiconductor Thermal Measurement and Management Symposium, 2005, IEEE Twenty First Annual, 2005; San Jose, CA, USA.

\* cited by examiner

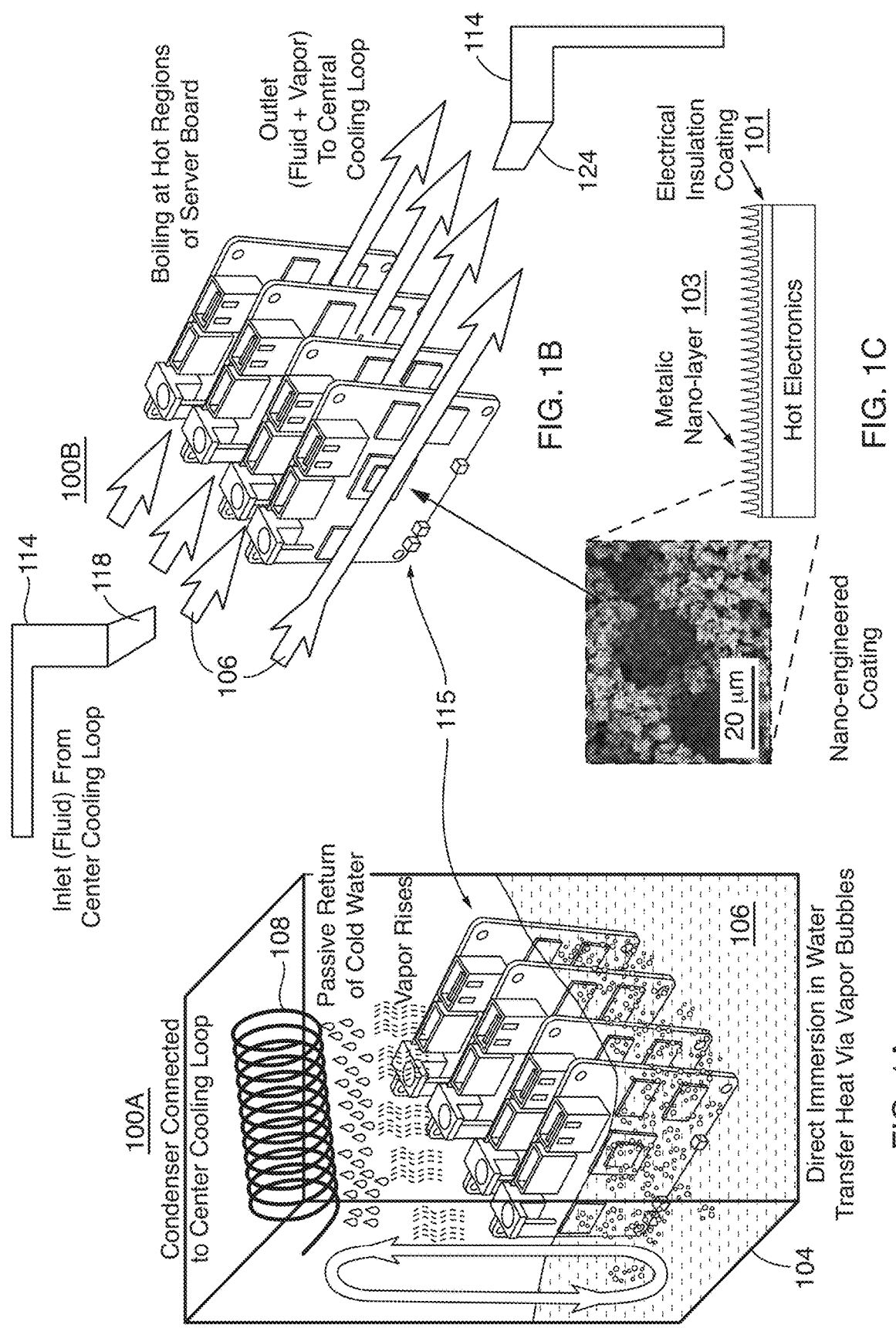

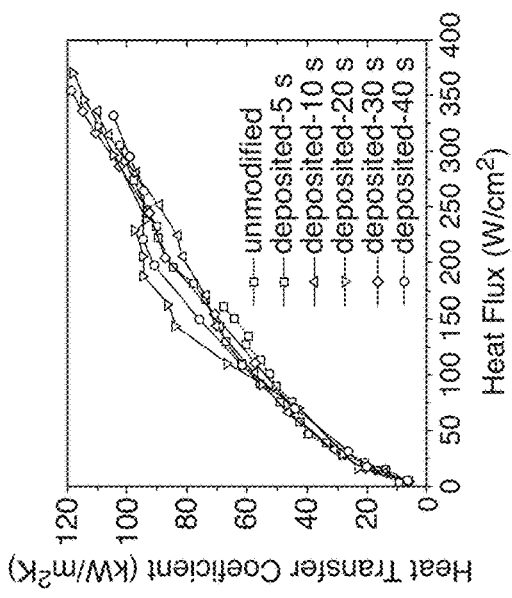
FIG. 2A
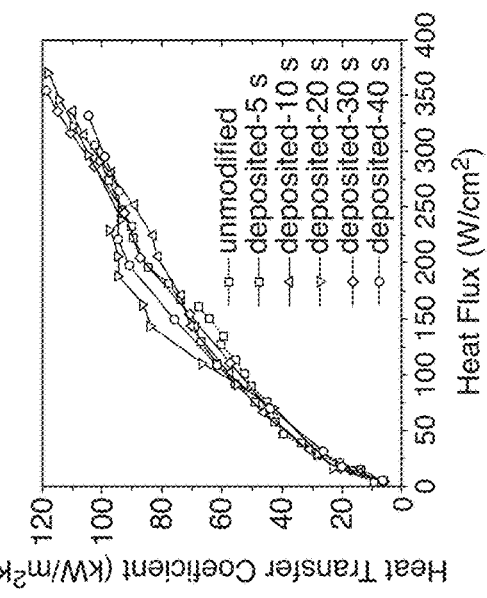
FIG. 2B
FIG. 2C
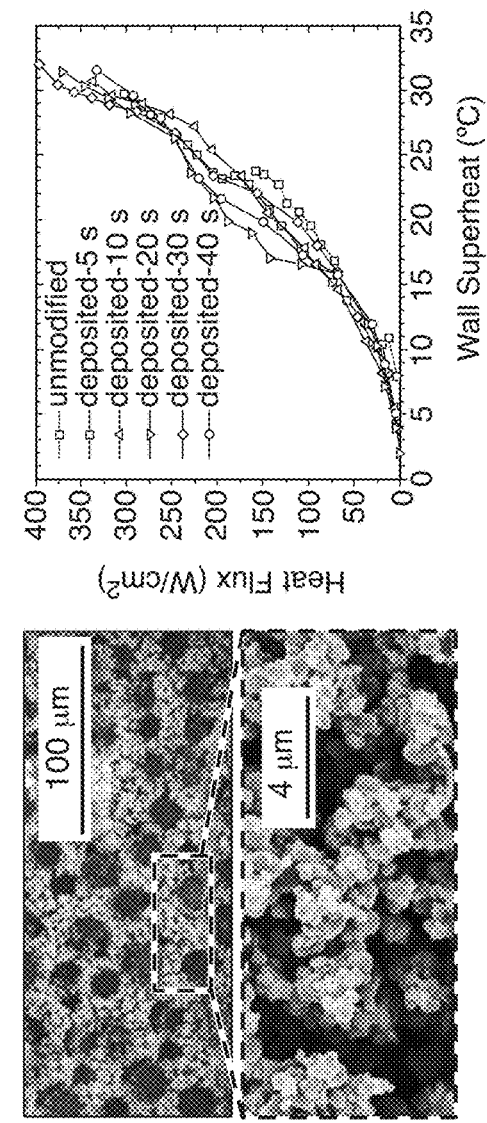
FIG. 2D
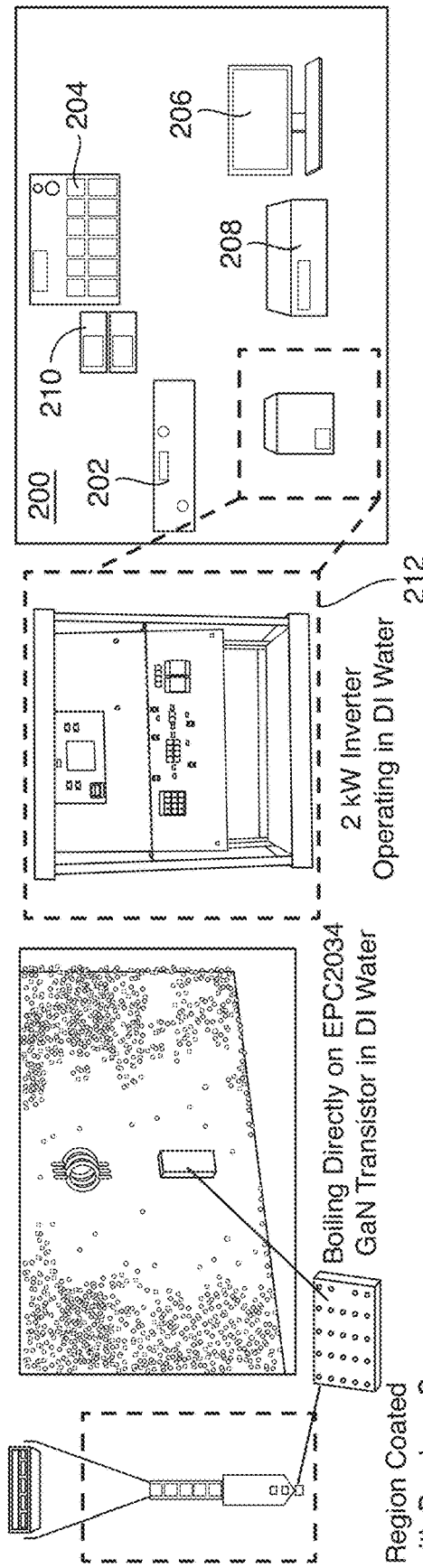
FIG. 2E

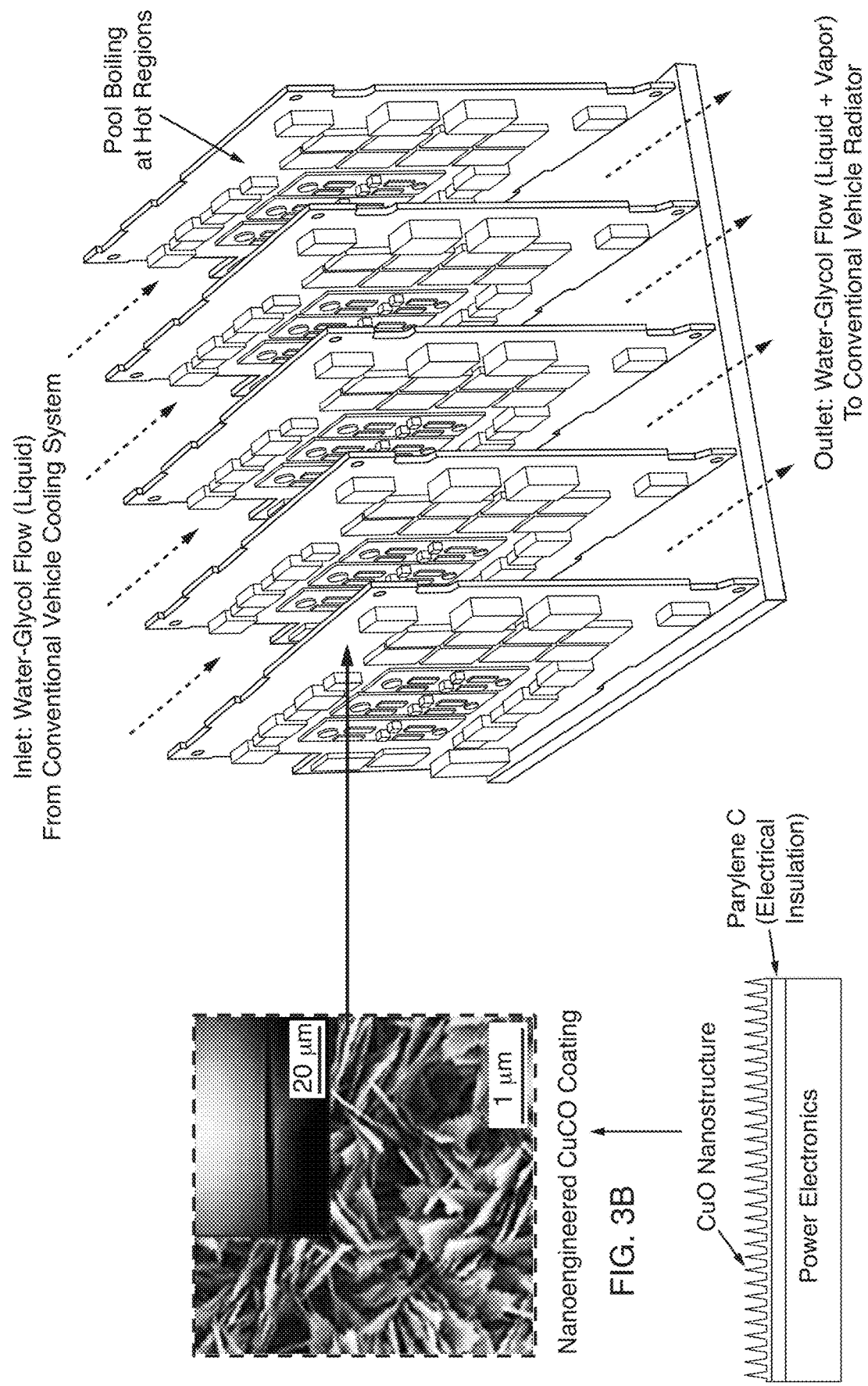

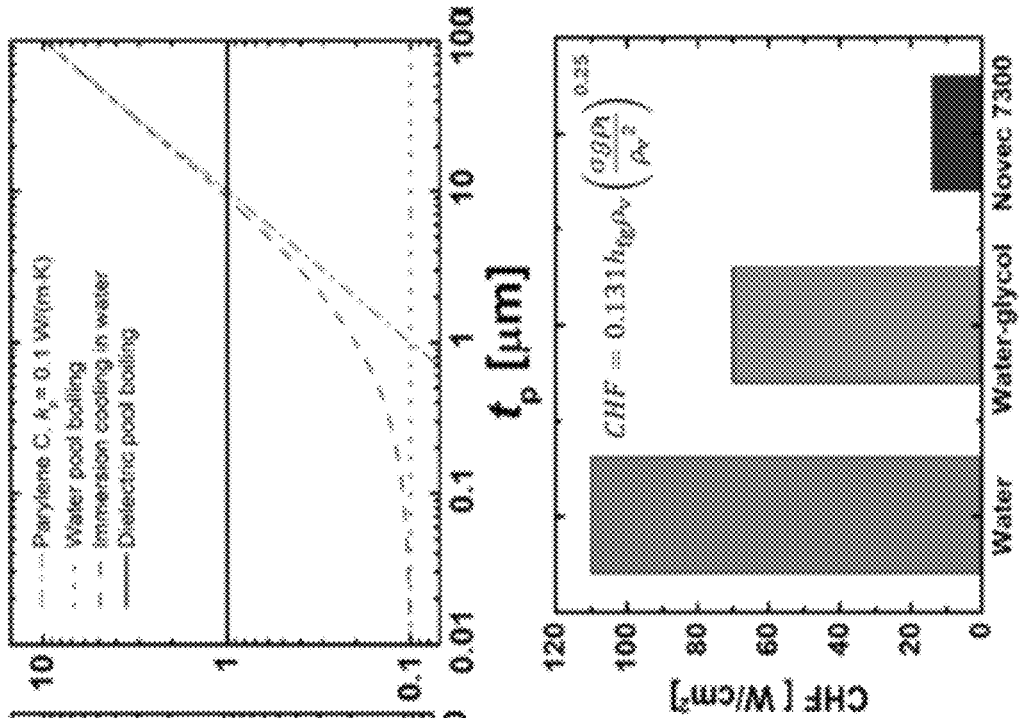
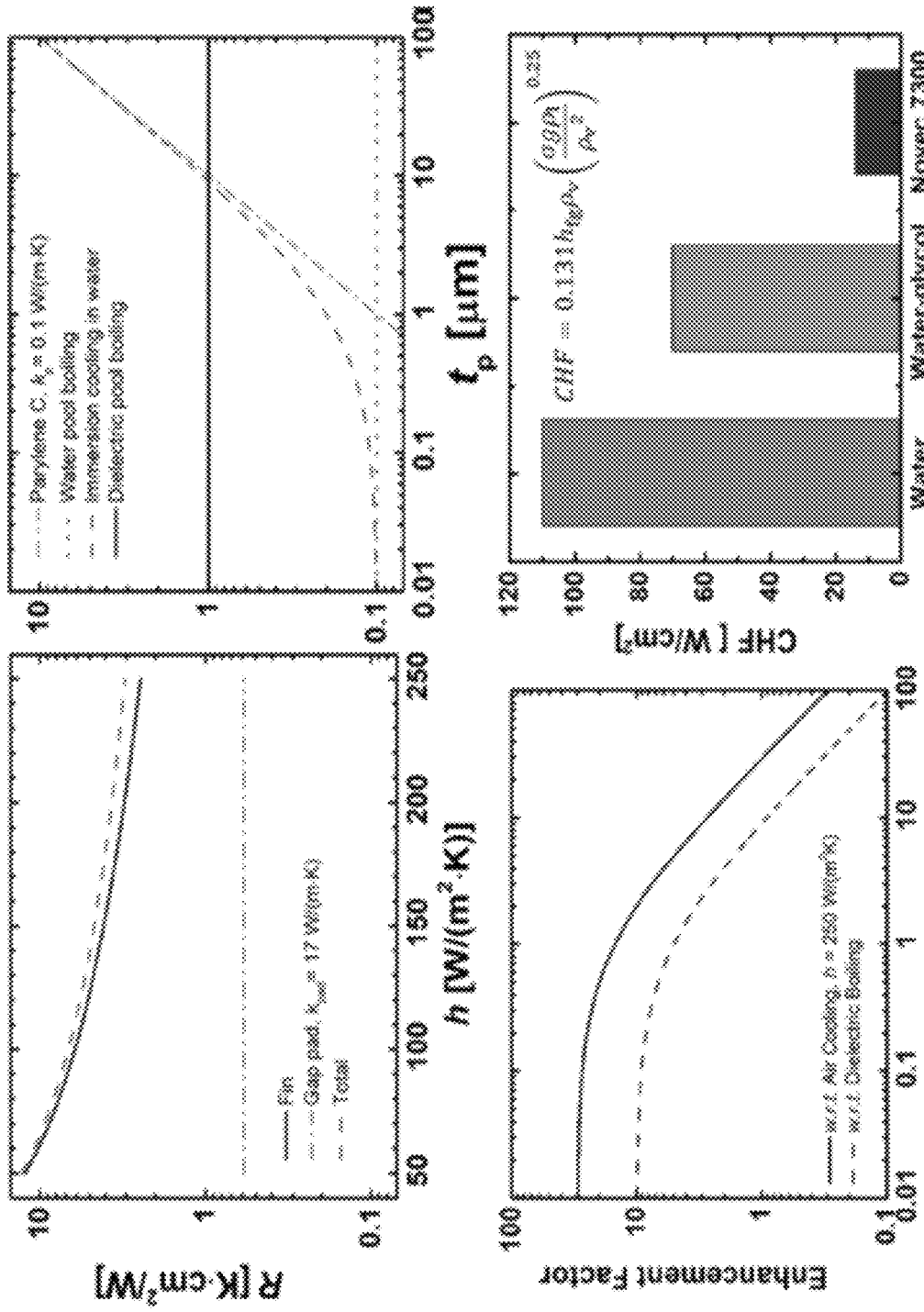
FIG. 6A  FIG. 6B  FIG. 6C  FIG. 6D

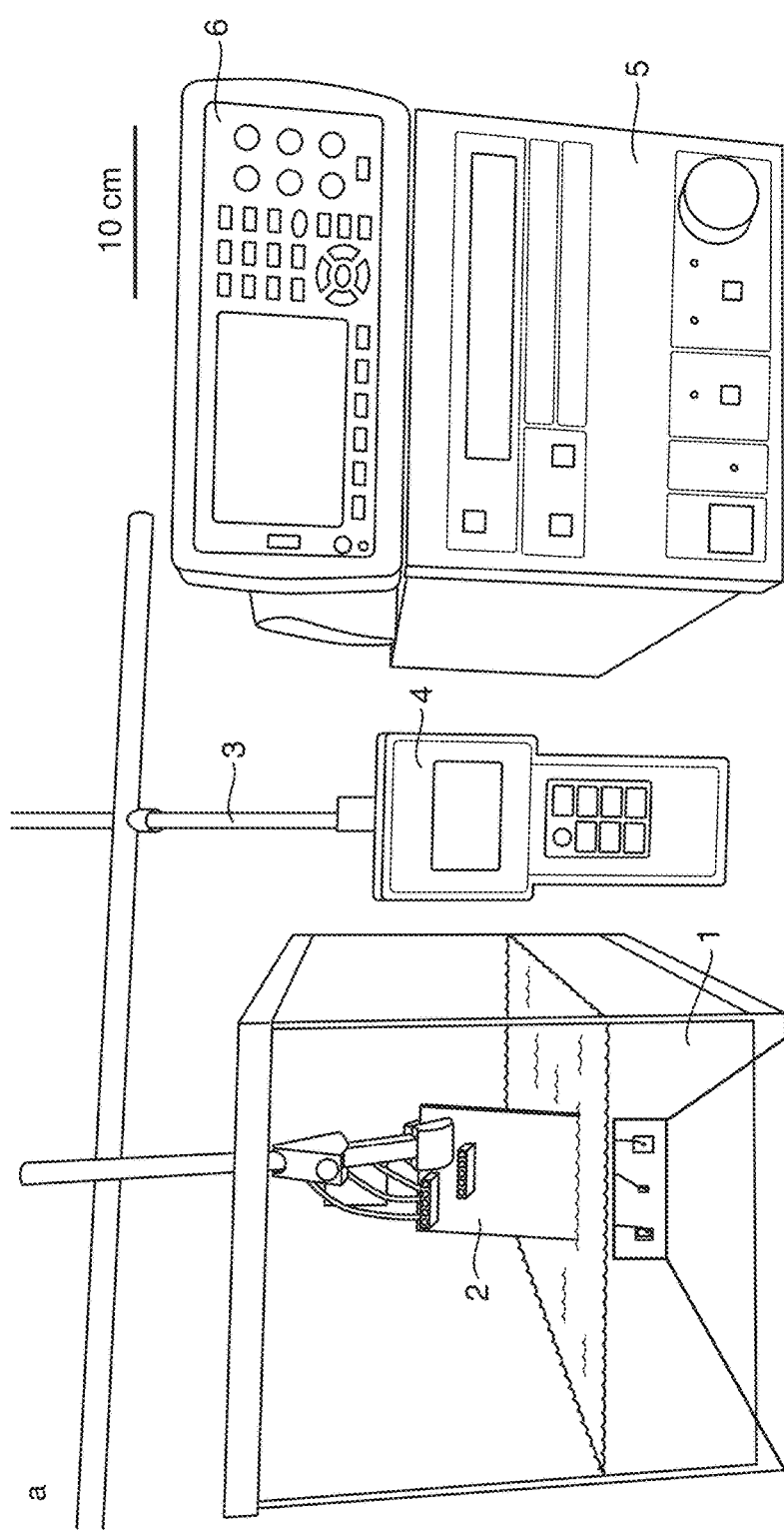
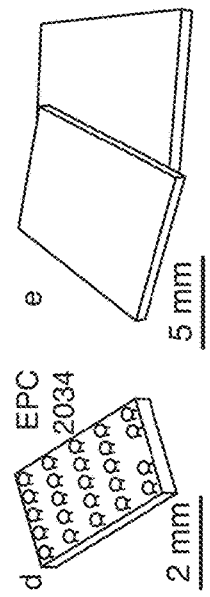
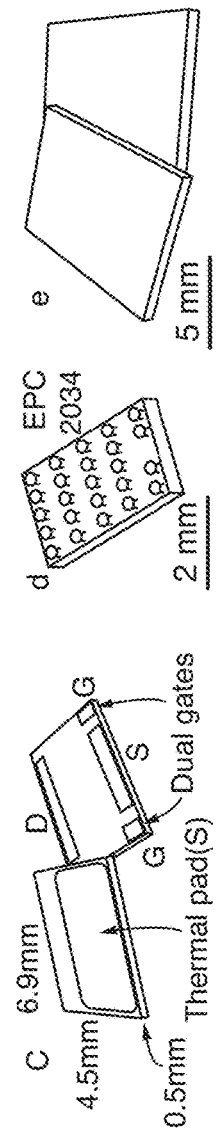
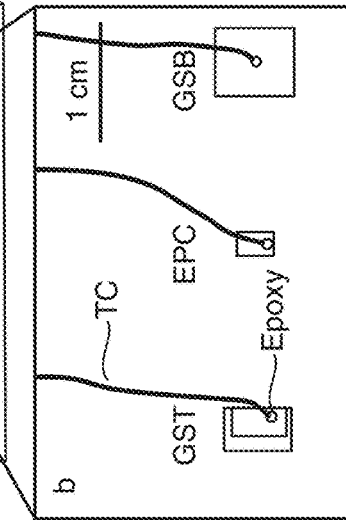
FIG. 7A
FIG. 7B
FIG. 7C
FIG. 7D
FIG. 7E

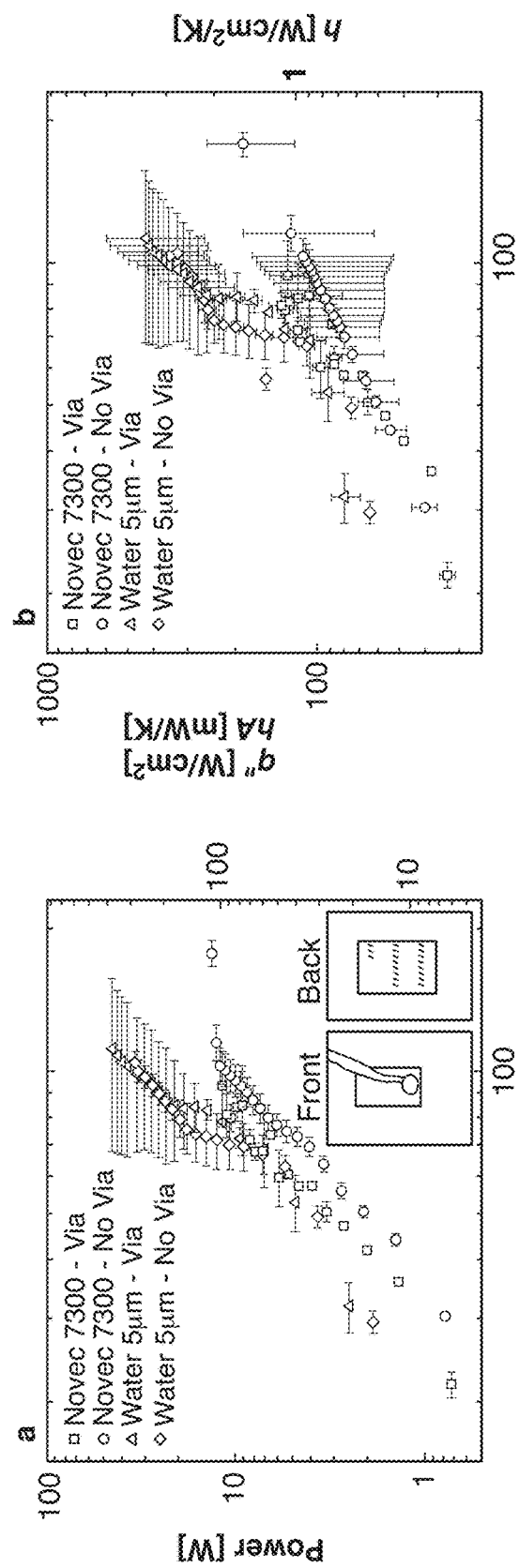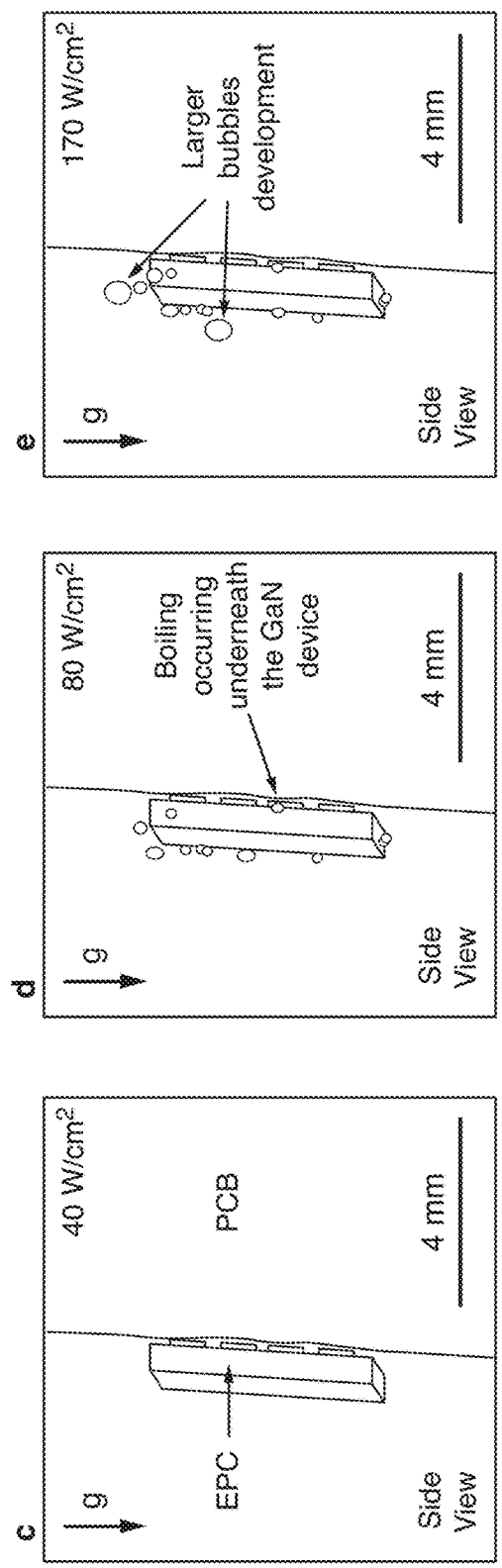
FIG. 13A
FIG. 13B
FIG. 13C
FIG. 13D
FIG. 13E

IMMERSION COOLING WITH WATER-BASED FLUID USING NANO-STRUCTURED COATING

RELATED APPLICATIONS

This application claims the benefit under 35 U.S.C. § 119(e) of U.S. Provisional Patent Application No. 62/910,365, filed Oct. 3, 2019, which is incorporated herein by this reference in its entirety.

FEDERALLY SPONSORED RESEARCH OR DEVELOPMENT

This disclosure was made with government support under EEC-1449548 awarded by the National Science Foundation. The government has certain rights in the invention.

BACKGROUND

High performance data centers are a multi-billion dollar industry and a constantly growing global electrical load. As machine learning and big data analytics are applied to tackle challenging problems (revolutionizing diagnostic healthcare, forecasting dynamic changes in the environment and weather, accelerating the pace of product development and industrial research and development, etc.) grows over the next decade, the fraction of total energy in the United States utilized by data centers, which today is approximately 2% (i.e. ~70 billion kW/hr or 70 TW/hr), is expected increase dramatically. Thermal management is a bottleneck to increasing the computational performance of modern data centers in terms of density (Gflops/L) and efficiency (Gflops/W). On average, approximately 20-30% of the energy demand from a data center is utilized to reject heat. Furthermore, server packaging density is limited by the spatial requirements of air or single-phase liquid architectures. Thus, improving heat transfer would enable system improvements for both density and efficiency.

Two shortcomings of modern air-cooled and liquid-cooled thermal management schemes are the thermal interface material (TIM), which provides mechanical compliance and electrical isolation at the cost of poor heat transfer. Due to the poor heat transfer of the TIM, larger heatsinks or faster fluid flow rates are required to reject the heat. These TIMs, however, are also a bottleneck for thermal management of high power electronics for more-electric vehicles (i.e. planes, trains, ships, automobiles, and off-highway vehicles) and limit the maximum heat flux and power density (kW/L) performance metric.

TABLE 1

| Cooling Method | Heat Flux (W/mm$^2$) | Chip-to-Coolant Thermal Resistance, Rth (cm$^2$K/W) |
|---|---|---|
| Air Cooling | 0.05 to 0.3 | 10 |
| Single-Phase Pumped Liquid | 0.4 to 0.13 | 2 |
| Immersion Dielectric Fluid | 0.1 to 0.3 | 0.2 |
| Two-Phase Pumped Liquid | 0.6 to 2.5 | 0.2 |
| Heat Pipe & 3D Vapor Chamber | 0.8 to 2.5 | 0.2 |
| Jet Impingement & Spray | 0.9 to 2.8 | 0.1 |
| Proposed Water Immersion | 2 to 10 | 0.05 |

A survey of publically available SOA heat flux and thermal resistances for deployed data center cooling schemes is provided in Table 1. In SOA immersion cooled systems, electronic components are submerged into a bath of dielectric heat transfer liquid, which has a higher thermal conductivity and hence heat conduction than air (≈0.01 W/mK) or oil (≈0.1 W/mK). Due to the dielectric fluid low boiling point (49° C.), the fluid boils on the surface of heat generating components and rising vapor transfers the heat to a condenser on top of the liquid pool. In contrast to submersion, jet, or spray oil cooling (Table 1), the dielectric fluids used in SOA systems offer similar high heat fluxes while also being clean, environmentally friendly, and non-flammable. No heatsinks, pumps, or jets are required to keep hardware cool, and circulation happens passively by the boiling process.

In dielectric fluids, the energy consumption to run the cooling fluid through the condenser is minimal due to the large area for condensation, the characteristically high heat transfer coefficient during condensation (~10,000 W/m$^2$K), and the ability to use large diameter tubes with minimal pressure drop. Furthermore, the elimination of packaging materials and thermal interface materials (TIMs) for the heat spreader devices means that efficient heat transfer can occur right on the device, with minimal parasitic thermal losses. Thus, compared to traditional air, water, or oil spray cooling, immersion cooling utilizes less energy.

At least one limitation to SOA immersion cooling, however, is the need to use dielectric working fluids in order to avoid short circuiting of electrical components. This limitation results in at least two fundamental disadvantages. First, the low boiling point of non-polar fluids means that electronics components cannot exceed the boiling temperature (≈50° C.) by an appreciable amount due to the formation of a vapor blanket and critical heat flux CHF). Second, the maximum heat flux attainable in the system is equal to the CHF of the working fluid, which for non-polar dielectric fluids is much smaller (<20 W/cm$^2$) than what is needed for next generation high power density systems. Some efforts to further enhance the CHF have adopted mesh heat spreaders that increase surface area and nucleation sites, and thus, enhanced boiling. Yet, these schemes all re-introduce TIMs, which introduce a strict theoretical limit on the minimum thermal resistance that can be achieved.

Another disadvantage to SOA systems is their limited development for mobile electronics platforms. Most research and applications have focused on stationary systems, with little work on flow configurations in moving vehicle architectures.

BRIEF DESCRIPTION OF THE DRAWINGS

A more particular description of the disclosure briefly described above will be rendered by reference to the appended drawings. Understanding that these drawings only provide information concerning typical embodiments and are not therefore to be considered limiting of its scope, the disclosure will be described and explained with additional specificity and detail through the use of the accompanying drawings.

FIG. 1A is a schematic diagram of an example immersion cooling approach for passive immersion according to some embodiments.

FIG. 1B is a schematic diagram of an example immersion cooling approach for pumped immersion according to some embodiments.

FIG. 1C is a top microscopic image and side diagram illustrating coating electronics directly with an electrically insulating nano-engineered coating that allows water-glycol or deionized (DI) water to be used to increase heat transfer according to various embodiments.

FIG. 2A is a scanning electron micrograph (SEM) image of fabricated copper-based porous surfaces according to an embodiment.

FIG. 2B is a graph illustrating pool boiling heat flux according to some embodiments.

FIG. 2C is a graph illustrating heat transfer coefficients of cathodic-deposited surfaces corresponding to the pool boiling heat flux (FIG. 2B) according to some embodiments.

FIG. 2D is an image of a printed circuit board (PCB) with electronics coated with Parylene C before and after boiling within DI water, according to an embodiment.

FIG. 2E is an image of a 2 kW, 1 kV inverter after coating with Parylene C and operating within DI water, according to an embodiment.

FIG. 3A is a simplistic diagram illustrating power electronics covered by a nano-engineered surface, which includes a textured oxide layer (e.g., CuO) disposed on an electrical insulation layer such as Parylene C, and enables the power electronics to be immersed in water or water-glycol according to some embodiments.

FIG. 3B is an SEM image of the nano-engineered surface of FIG. 3A according to an embodiment.

FIG. 3C is a schematic diagram of multiple electronics boards prepared as in FIGS. 3A-3B being liquid cooled in a water-glycol solution of a vehicle cooling system according to an embodiment.

FIG. 6A is a graph illustrating the thermal resistance (R) of air cooling as a function of the convection heat transfer coefficient (h) and thickness ($t_p$) according to an embodiment.

FIG. 6B is a graph illustrating immersion cooling in a dielectric fluid (Novec 7300, 3 M) and in deionized water with a Parylene C coating for electrical insulation, as a function of the Parylene C thickness ($t_p$), according to an embodiment.

FIG. 6C is a graph illustrating an enhancement factor (thermal resistance reduction) of water immersion cooling with Parylene C with respect to dielectric fluid pool boiling and forced air cooling with a convective heat transfer coefficient (h) of 250 W/(m² K).

FIG. 6D is a bar graph illustrating critical heat flux (CHF) as obtained from the Zuber correlation for water, a 50-50 by volume water-ethylene glycol mix, and Novec 7300 dielectric fluid, according to various embodiments.

FIG. 7A is a photograph of an experimental setup used to conduct immersion cooling tests, according to some embodiments.

FIG. 7B is an photograph of a high-magnification image of the transistors residing on the PCB showing the GaN systems top cooled (GST), GaN systems bottom cooled (GSB), and EPC 2034 (EPC) devices, according to some embodiments.

FIGS. 7C, 7D, 7E are images illustrating thermocouples (TC) attached to the surface of the transistors via epoxy and which illustrate the dimensions and footprints of the GST, EPC and GSB, and GaN devices, respectively.

FIG. 13A is a graph of power dissipated as a function of device surface-to-fluid temperature difference ($\Delta T$) for a top cooled EPC2034 transistor having a through-PCB copper via and back gold pad, according to an embodiment.

FIG. 13B is a graph of device conductance (UA) as a function of device surface-to-fluid temperature difference ($\Delta T$) for a top cooled EPC2034 transistor having a through-PCB copper via and back gold pad, according to an embodiment.

FIGS. 13C, 13D, 13E are side views of SEM time-lapse images showing bubble generation underneath the EPC device and on the top surface, according to some embodiments.

DETAILED DESCRIPTION

Figure 1D:
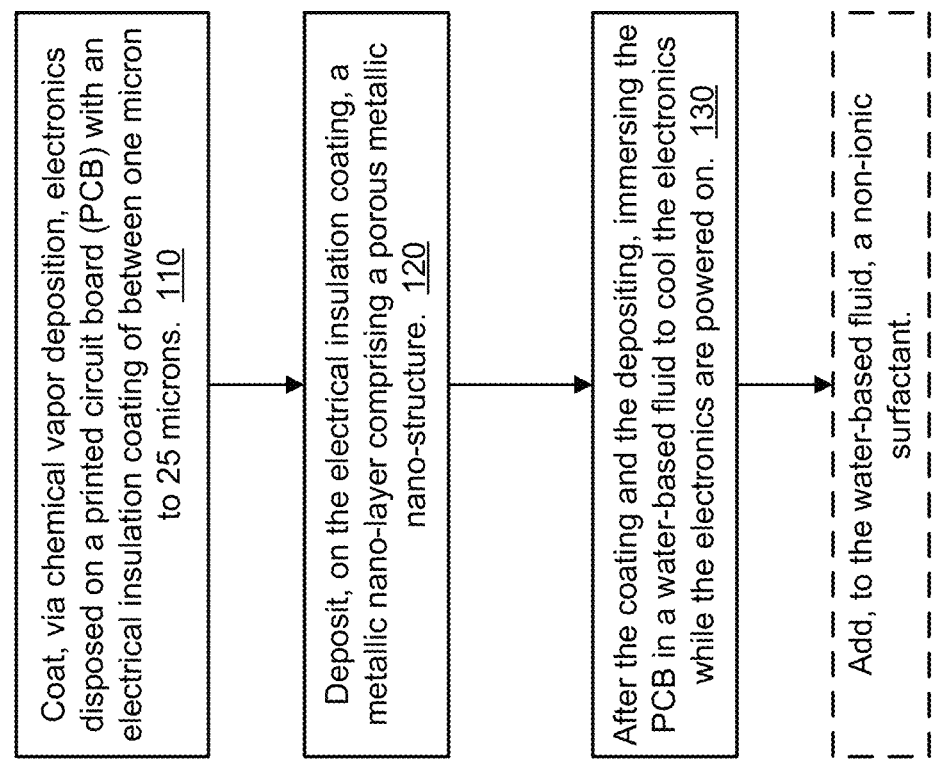
FIG. 1D is flow chart of a method for cooling electronics on a printed circuit board (PCB) according to an embodiment.

By way of introduction, the present disclosure describes nanostructure-enhanced immersion cooling for high power density electronics thermal management. Most high heat flux and methods that do not user thermal interface materials (TIMs) such as oil spray and jet impingement require large capital investment for pumps, integration, and safety. This disclosure seeks to demonstrate a low-cost, scalable method for coating electronics hardware (for servers, traction vehicles, and the like) so the electronics can be cooled efficiently with direct immersion in water and push the bounds of performance density (kW/L for power electronics and Gflops/L for computational) and efficiency offered by promising state-of-the-art (SOA) approaches.

More specifically, this disclosure discusses use of immersion cooling of electronics directly in water. To do so, a printed circuit board (PCB) and disposed electronics can be electrically-insulated from water in nano-layers such as Parylene C coatings. Demonstrated experimentally is the effectiveness of conformal layers of Parylene C as thin as 1 μm in preventing current from leaking between the electronic components and the surrounding water when the system is subjected to voltages up to 200 Volts. Furthermore, the heat flux and convection heat transfer coefficient obtained is in 3 M Novec 72DE and 7300 dielectric fluids, water, and a 50/50 in volume mixture of water and ethylene glycol (WEG) as a function of hot-spot-to-fluid temperature difference in both natural convection and nucleate pool boiling regimes. Gallium Nitride (GaN) transistors with different board-mounting techniques and thermal pad locations are used as heat sources. Heat fluxes up to 562 W/cm$^2$ are measured in water. As a proof of concept, water immersion cooling is tested successfully on a 2 kW power converter operating at 97.2% efficiency in deionized water. This study not only demonstrates immersion cooling in water of high-power density electronics, but also develops design guidelines for cooling of electronic components through the use of novel electrically insulating coatings coupled with attractive electrically conducting cooling media.

Thus, in various embodiments, demonstrated is phase-change cooling (with water) greater than 5 W/mm$^2$ while maintaining chip junction temperatures within safe temperature limits, a dramatic improvement over the 2.5 W/mm$^2$ capable with aggressive industrial approaches today. Adjusting the system saturation pressure enables control over the boiling temperature, and subsequently, the device junction temperature, which enables customization for different electronics device specifications for ensuring the chip junction temperature can be maintained within safe operating conditions. Some advantages of this technology over SOA methods include: 1) the ultra-low thermal resistance coating overcomes the bottleneck of TIMs while still maintaining electrical isolation, 2) the nano-structuring of this coating to minimize bubble nucleation site diameter (and thus increase frequency of bubble formation) enables ultra-high heat flux cooling, and 3) the ability to enable the easy tuning of the boiling point, and thus, the junction temperature via control of the saturation pressure.

FIG. 1A is a schematic diagram of an example immersion cooling approach for passive immersion according to some embodiments. Electronics boards can be at least partially immersed in a water-based fluid such deionized (DI) water or a water and ethylene glycol (WEG) mixture. The high temperatures of the electronics can transfer heat to vapor bubbles as the water-based fluid boils. This vapor rises to the surface of the fluid and through the air until condensing back in the water-based fluid within a central cooling loop. This process provides a passive return of cold water for further cooling.

FIG. 1B is a schematic diagram of an example immersion cooling approach for pumped immersion according to some embodiments. In this embodiment, fluid flows from an inlet of a central cooling loop and is forced passed the electronics boards, which will boil the fluid at least in part. Thus, exiting from the electronics boards include some fluid and some vapor that continues on through a cooling loop where the vapor and warmer fluid can be re-cooled and recirculated through the cooling loop.

FIG. 1C is a top microscopic image and side diagram illustrating coating electronics directly with an electrically insulating nano-engineered coating that allows water-glycol or deionized (DI) water to be used to increase heat transfer according to various embodiments. In various embodiments, the nano-engineered coating includes an electrical insulation coating 101, e.g., a dielectric such as silicon dioxide, silicon nitride, Parylene C, Parylene HT, Parylene N, other Parylene-based compound, or the like (although Parylene C is used throughout as the experimental coating, and is thus heavily reference by way of example). In various embodiments, the nano-engineered coating further includes a metallic nano-layer 103 that includes a porous metallic nano-structure deposited on the electrical insulation coating 101.

In some embodiments, the nano-engineered surface immersion cooling approach builds on components with an ultra-thin (≈1 μm but up to ~25 μm), ultra-conformal, pinhole-free, high dielectric constant (e.g., 5,600 V/mil) Parylene C coating, so that the electronics are electrically passivated and isolated from the top nanostructure coating and working fluid. In some embodiments, on top of the Parylene C (or similar) coating, a layer of copper (Cu) (or copper-based metal layer) can be scalably electrodeposited on the arbitrarily-shaped and designed electronics board using cathodic deposition to produce a super-hydrophilic, super-nucleating coating. The electrically insulating Parylene C allows the use of ethylene glycol-water mix or DI water as the working fluid.

Modern data centers and traction vehicles have precise control over contaminants in their cooling loops so the disclosed cooling scheme has significant advantages over the SOA. By first coating the electronics, use of fluids for cooling is reasonable. The ultra-high latent heat of phase change (1.2 MJ/kg for WEG versus 0.3 MJ/kg for dielectric fluids) and surface tension (35 mN/m versus 5 mN/m) of WEG enable highly efferent pool boiling heat transfer that has at least one order of magnitude increase in critical heat flux (~1.5 W/mm$^2$) when compared to dielectric liquids (~0.15 W/mm$^2$).

FIG. 1D is flow chart of a method 102 for cooling electronics on a printed circuit board (PCB) according to an embodiment. The method can be performed via a number of coating and deposition techniques as discussed herein, in addition to a number of cooling techniques described herein. At operation 110, the method includes coating, via chemical vapor deposition, electronics disposed on a printed circuit board (PCB) with an electrical insulation coating of between one micron to 25 microns. For example, the electrical insulation coating can be a dielectric such as silicon dioxide, silicon nitride, Parylene C, Parylene HT, Parylene N, or the like.

At operation 120, the method includes depositing, on the electrical insulation coating, a metallic nano-layer comprising a porous metallic nano-structure. For example, the porous metallic nano-structure can be one of copper or copper oxide or other metallic nan-structure that is porous or textured.

At operation 130, the method includes, after the coating and the depositing, immersing the PCB in a water-based fluid to cool the electronics while the electronics are powered on. For example, the immersing the PCB in the water-based fluid can include one of immersion that relies on passive return of condensed water and immersion performed via injected fluid from a central cooling loop. At operation 140, the method optionally includes adding, to the water-based fluid, a non-ionic surfactant.

With additional reference to FIG. 1A, in one embodiment, a cooling system 100A includes a container 104 having a water-based fluid 106 in which are immersed printed circuit boards (PCBs) 115, wherein high-thermal electronics are disposed on the PCBs 115. The cooling system 100A can further include a condenser 108 to cause water vapor generated by the high-thermal electronics to condense and passively return to the water-based fluid. In embodiments, the water-based fluid includes one of deionized water or a mixture of water and ethylene glycol, and optionally also a non-ionic surfactant.

With additional reference to FIG. 1B, in another embodiment, a cooling system 100B includes a central cooling line 114 that circulates the water-based fluid 106 in a loop to cool mechanical and electrical components of a machine, such as an engine or other automotive or industrial machine. The cooling system 100B can further include an injector 118 coupled to the central cooling line 114 and adapted to force the water-based fluid 106 past PCBs 115 on which are disposed high-thermal electronics. An output 124 is coupled to the central cooling line 114 to recycle vapor and residual water-based fluid exiting the PCBs 115. In embodiments, the water-based fluid includes one of deionized water or a mixture of water and ethylene glycol, and optionally also a non-ionic surfactant.

In the embodiments of FIGS. 1A-1B, a nano-engineered coating is deposited over the high-thermal electronics. The nano-engineered coating can include an electrical insulation coating of between one micron to 25 microns in thickness deposited on the high-thermal electronics; and a metallic nano-layer comprising a porous metallic nano-structure deposited on the electrical insulation coating.

FIG. 2A is a scanning electron micrograph (SEM) image of fabricated copper-based porous surfaces according to an embodiment. FIG. 2B is a graph illustrating pool boiling heat flux according to some embodiments. FIG. 2C is a graph illustrating heat transfer coefficients of cathodic-deposited surfaces corresponding to the pool boiling heat flux (FIG. 2B) according to some embodiments. Porous microstructures created through scalable and conformal cathodic deposition have been shown by the AquaQuant's preliminary results to significantly increase the capillarity at the surface, and hence enhance re-wetting of liquid after bubble departure, delaying pool boiling critical heat flux from 1.50 W/mm$^2$ on smooth Cu surfaces to greater than 4 W/cm$^2$ on the micro-structured surfaces (FIG. 2B).

To benchmark the immersion cooling technique proposed here with SOA cooling methods, we have calculated thermal resistances of comparing the immersion cooling and SOA air cooling approaches. The addition of a thicker Parylene C coating acts to increase thermal resistance while also increasing the electrical isolation. The calculations show that, for Parylene C coating thicknesses greater than 1 μm (2 K/W), an enhancement of approximately 700% over SOA forced-air cooling (14 K/W) exists. The proposed immersion method also has the potential to increase device reliability due to the elimination of the need for applying pressure to mate the thermal component to the silicon processor simplifying system integration.

FIG. 2D is an image of a printed circuit board (PCB) with electronics coated with Parylene C before and after boiling within DI water, according to an embodiment. FIG. 2E is an image of a 2 kW, 1 kV inverter 212 after coating with Parylene C and operating within DI water, according to an embodiment. FIG. 2E further illustrates a high-current power supply 202, a Chroma electronic load 204, a National Instruments Measurement Automation 206, a control power supply 208, and a Yokogawa WT310 210 for efficiency measurement that provided the experimental setup. The proposed direct water immersion method has been demonstrated with an (i) experimental hardware using chip-scale packaged GaN transistors coated with an approximately 25 μm coating of Parylene C for both a custom thermal diagnostic board (FIG. 2D), which was used to measure the heat flux and thermal resistance, and (ii) functional 2 kW, 1 kV traction inverter prototype (FIG. 2E). The thermal diagnostic board achieved stable boiling heat fluxes approaching 4 W/mm$^2$ with no sign of Parylene C coating degradation after 2 weeks.

During cathodic deposition of the porous microstructure, hydrogen bubbles leaving the surface act as a template for patterning nucleation sites to promote high-frequency bubble departure. A 30-second deposition yielded a surface with high capillarity and enabled preliminary pool boiling heat flux measurements of 4 W/mm2 (FIG. 2B), which exceeds many SOA schemes for the tested superheat and is within 20% of the projected target for this work. The elevated CHF compared to smooth substrates results from high wickability and bubble nucleation density, showing significant potential to achieve heat fluxes greater than approximately 5 W/mm$^2$ with further optimization of the nano-engineered coating fabrication and integration with electronics. The traction inverter (FIG. 2E) exhibited an increased maximum power processing and an improved converter efficiency while showing no signs of Parylene C damage due to high voltage switching after steady operation in water for an extended period of time. The disclosed methods of nano-structuring coatings has been shown to facilitate the enhanced heat transfer required to catalyze the deployment of next-generation electronics for high performance computing and more-electric vehicles.

FIG. 3A is a simplistic diagram illustrating power electronics covered by a nano-engineered surface, which includes a textured oxide layer (e.g., CuO) disposed on an electrical insulation layer such as Parylene C, and enables the power electronics to be immersed in water or water-glycol according to some embodiments. FIG. 3B is an SEM image of the nano-engineered surface of FIG. 3A according to an embodiment. FIG. 3C is a schematic diagram of multiple electronics boards prepared as in FIGS. 3A-3B being liquid cooled in a water-glycol solution of a vehicle cooling system according to an embodiment.

In various embodiments, cooling can be achieved based on two-phase boiling heat transfer on regions of the electronics where hot spots exist, mitigating hot spot formation, and allowing efficient operation. Furthermore, the developed immersion cooling approach can allow coordinating increased flow of thermal and electrical power in a 3D-stacked environment, e.g., multi-phase auxiliary converters, motor drives. Once heat has been removed off-device, the working fluid (e.g., water-glycol) dissipates the heat to the conventional vehicle radiator, thereby eliminating complexity and increasing ease of integration into existing commercial systems.

In various embodiments, the use of electrically insulating nano-engineered coatings i) enables the use of water-glycol as the working fluid to reach boiling heat fluxes much higher than state of the art (>300 W/cm$^2$), and ii) increase surface capillarity to delay critical heat flux at hot spots. Parylene C coatings have been developed for electrical isolation coupled with optimized super-hydrophilic material coatings to minimize coating thickness and thermal parasitic losses, and maximize capillary pumping. Nano-structuring will be achieved through a highly scalable and low temperature hydrothermal technique of a deposited metal. A power electronics module can be provided that is compatible with the coating technique, which can be achieved with the all-surface-mount, low-profile power converters. The example converter considered here can be the bidirectional DC-DC boost converter (10-50 kW) typically employed in hybrid electric cars to interface the low (~200 V) battery voltage to the high (~800-1000 V) motor drive. The final immersion cooling architectures can be modular and scalable so that the technique can be used for multiple power electronics applications and environments. In various embodiments, this project addresses the IAB core interests of: 1) advancing the TRL level for system integration of existing Engineering Research Center for Power Optimization for Electro-Thermal Systems (POETS) technologies, 2) developing highly innovative module-level electronics packaging for WBG power semiconductors, and 3) enabling radically simplified and potentially more reliable module manufacturing techniques.

The disclosed nano-engineered surface immersion cooling approach builds on SOA immersion cooling techniques with significant advantages. By first coating the electronics components with an ultra-thin (≈10 μm) and ultra-conformal high dielectric constant (5,600 V/mil) Parylene C coating, the electronics are electrically passivated and isolated from the top nanostructure coating and working fluid. Following the Parylene C coating, a thin layer of copper (≈2 μm) is sputtered on the electronics board and chemically oxidized to produce a super-hydrophilic nano-engineered CuO coating (FIG. 3A). The electrically insulating nature of Parylene C allows the use of ethylene glycol water mix as the working fluid which has significant advantages over SOA systems. The ultra-high latent heat of phase change (1.2 MJ/kg for water-glycol versus 0.3 MJ/kg for oil) and surface tension (35 mN/m for water-glycol mixtures versus 5 mN/m for oil) of water-glycol enable highly efferent pool boiling heat transfer that has an order of magnitude increase in heat flux when compared to dielectric liquids.

Figures 4A, 4B:
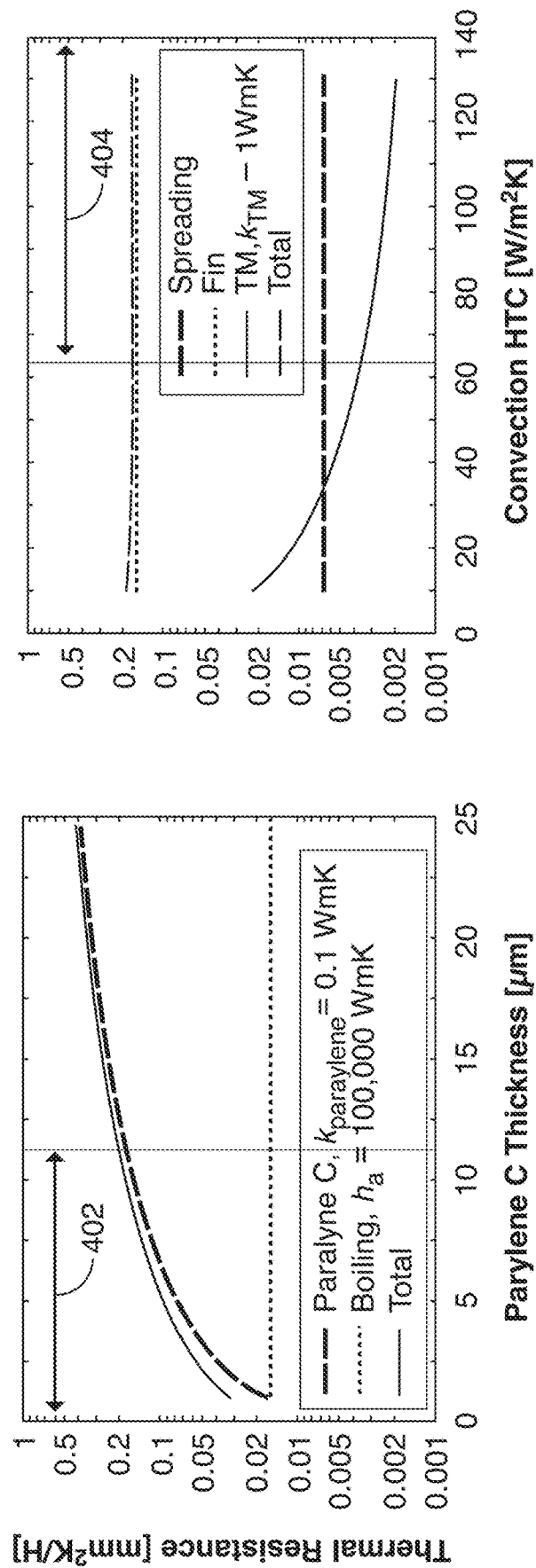
FIG. 4A is a graph of individual and total thermal resistances of immersion cooling using an air cooling approach according to an embodiment.
FIG. 4B is a graph of individual and total thermal resistances of SOA-forced air cooling according to an embodiment.

FIG. 4A is a graph of individual and total thermal resistances of immersion cooling using an air cooling approach according to an embodiment. FIG. 4B is a graph of individual and total thermal resistances of SOA-forced air cooling according to an embodiment. The air cooling approach assumes a heat sink of size 3×3×3 cm, with 10 fins. The heat sink thermal conductivity was assumed to be that of copper (385 W/mK). The TIM thermal conductivity was assumed to be 1 W/mK, with a thickness of 50 μm. The external convective heat transfer coefficient (HTC) was assumed to vary depending on whether forced or free convection is present. The GaN surface area was assumed to be 25 mm$^2$.

Regions 402 and 404 outline where each approach is advantageous. As seen in FIG. 4A, the addition of thicker Parylene C coatings acts to increase the thermal resistance of the immersion cooling approach while also increasing the electrical isolation. The calculations show that for thin Parylene C coating thicknesses (<8 μm, 0.1 mm$^2$K/W), an enhancement is seen of approximately 100% over conventional forced air cooling (0.2 mm$^2$K/W). Furthermore, the immersion approach will also eliminate complicated manufacturing steps such as cold plate and heat sink fabrication, as well as thermal interface materials (TIMs), which have been shown (POETS project 3M) to be a significant bottleneck for heat transfer. The proposed methods also has the potential to increase device reliability due to elimination of need for applying pressure to mate the thermal component (heat sink) to the GaN device. Currently employed TIM solutions typically require compressible soft conformal gap pads with poor thermal performance, or precision fabrication of hard surfaces with thermal grease and carefully applied pressure to achieve good thermal performance. Emerging low-thermal impedance packages such as chip-scale packaged GaN transistors require carefully controlled (and low) mechanical forces of any TIM solution, and TIM-induced cracking is a reliability bottleneck in current designs.

Figure 5B:
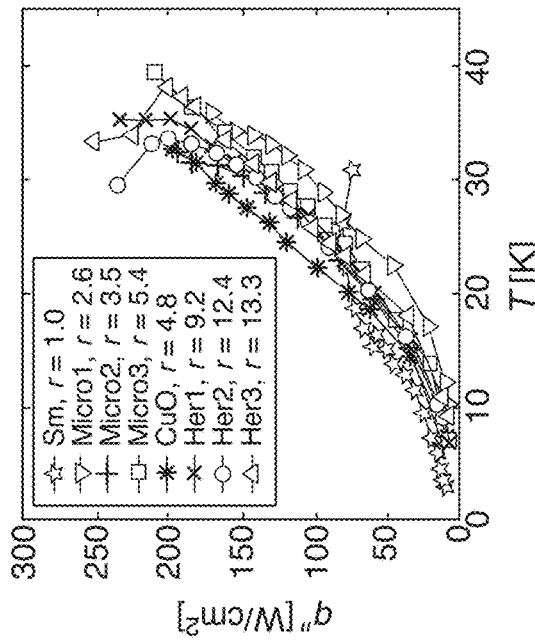
FIG. 5B is a graph illustrating critical heat flux (CHF) comparing smooth (SM) and microstructure silicon (micro) and CuO hierarchical surfaces (Hier) surfaces according to various embodiments.
Figure 5C:
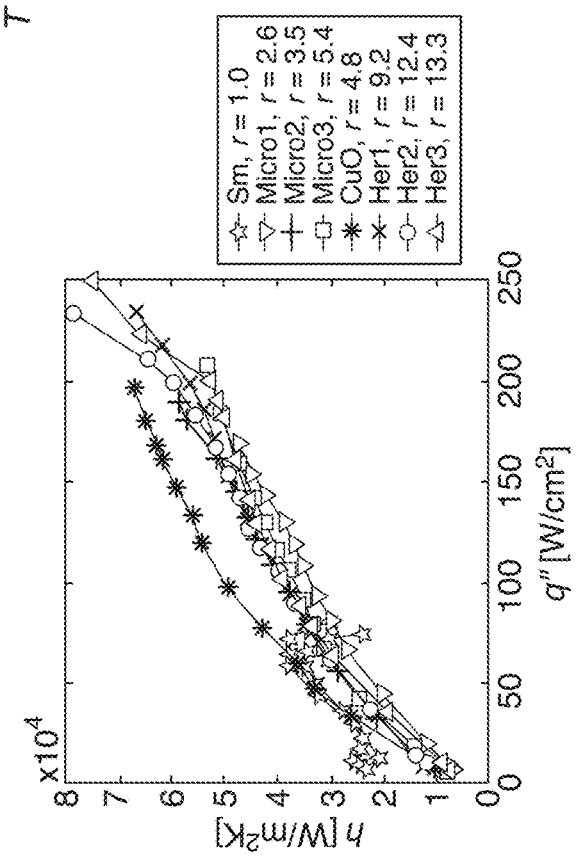
FIG. 5C is a graph illustrating heat transfer coefficients comparing smooth (SM) and microstructure silicon (micro) and CuO hierarchical surfaces (Hier) surfaces according to various embodiments.
Figure 5A:
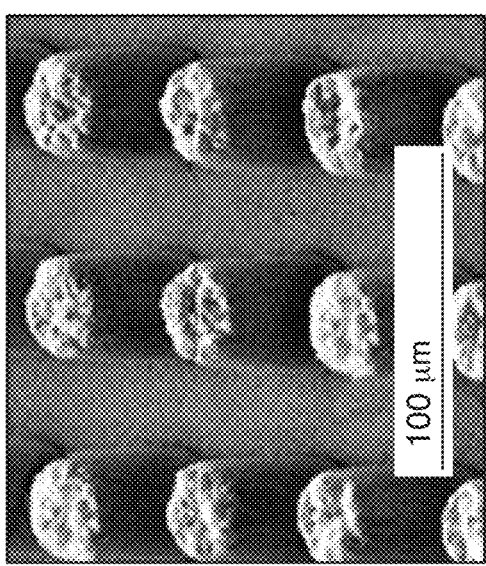
FIG. 5A is an SEM image of a fabricated copper oxide (e.g., CuO)-based hierarchical surfaces in a micro-pillar array according to an embodiment.

FIG. 5A is an SEM image of a fabricated copper oxide (e.g., CuO)-based hierarchical surfaces in a micro-pillar array according to an embodiment. In this example, the CuO micro-pillar array has heights 61 μm, diameters of 30 μm, and spacing of 30 μm. FIG. 5B is a graph illustrating critical heat flux (CHF) comparing smooth (SM) and microstructure silicon (micro) and CuO hierarchical surfaces (Hier) surfaces according to various embodiments. FIG. 5C is a graph illustrating heat transfer coefficients comparing smooth (SM) and microstructure silicon (micro) and CuO hierarchical surfaces (Hier) surfaces according to various embodiments.

The use of a nanostructured CuO coating does not only help to electrically isolate the electronics from the water-glycol working fluid (as a back-up to the Parylene C coating), nano-structures have been shown to significantly increase the capillarity at the surface (FIGS. 5A-5C), and hence enhance re-wetting of liquid after bubble departure. This acts to significantly delay the pool boiling critical heat flux from 100 W/cm$^2$ to greater than 300 W/cm$^2$. The first phase of the project utilizes metal oxide structures due to their ability to conformally coat the electronics surface, ease of scalability and fabrication, and semiconducting properties.

The recently developed flying capacitor multi-level (FCML) converter architecture (POETS project 2D) is an enabling technology, as it enables the design of power converters with flat and uniform surfaces needed for conformal coatings. Preliminary experiments using a 4-level GaN-based FCML converter designed for 1 kV, 3 kW operation using only surface-mount components with low-profile has been performed. Initial tests indicate successful Parylene C coverage of the full converter, with no leakage current from the converter to the working fluid. The electrical components were successfully coated with 4.5 μm and 25.1 μm thick Parylene C coatings. The inside surface of the pool boiling apparatus can be chrome coated in order to avoid corrosion and possible contamination of any of the experiments. The immersion cooling setup was modified with glass walls for optical imaging access to observe bubble departure dynamics and pool boiling behavior. With up to 60 V applied to the immersed PCB, no leakage current was detected, meaning the board was electrically insulated from the tap water. Current (up to 3.5 mA) was detected; however, when a voltage was applied between two wires (1 cm apart) loose in the water, confirming that the water was conductive.

As discussed, the ultra-high latent heat of phase change (2.4 MJ/kg for water-glycol versus 0.3 MJ/kg for dielectric fluids) and surface tension (50 to 73 mN/m for water-glycol mixtures versus 5 mN/m for dielectric fluids) of water and water-glycol mixtures enable highly efferent pool boiling heat transfer that has an order of magnitude higher critical heat flux (CHF) when compared to dielectric liquids. Furthermore, operating temperatures of electronics at atmospheric pressures could be extended to 100° C. for water or higher for water glycol mixtures (107° C. for water-ethylene glycol mixture of 50-50% by volume). Water-based fluids are currently utilized in many applications such as automotive cooling and hence would eliminate the need for additional working fluids for immersion cooling of electronics.

One challenge of implementing water immersion cooling is the electrical conduction of water due to its polar nature and the ionization it induces. To solve this problem, we first coat the electronic components such as Gallium Nitride (GaN) transistors on a PCB with an ultra-thin (≈1 to 25 μm) and ultra-conformal high dielectric constant (78 V/μm) Parylene C coating, hence electrically passivating and isolating components from the working fluid. The Parylene C coating can be deposited on the PCBs through a chemical vapor deposition (CVD) process that enables gas penetration into nanoscale trenches and crevices. This deposition technique is preferred over other methods such as spin coating and spray coating because CVD provides, for both organic and inorganic materials, an ultra-conformal coating with a uniform thickness.

Herein, we demonstrate the capability of a 5 μm layer of Parylene C to insulate the board and run up to 20 A of current through a GaN transistor without any short circuit occurring. We characterize the heat flux and heat transfer coefficient as a function of device-to-fluid temperature difference for deionized water, water-glycol mixture (50% by volume), and dielectric fluids (Novec 72DE and Novec 7300), demonstrating an enhancement in the heat dissipated with the water-based fluids. This study not only demonstrates immersion cooling in water and water-glycol mixtures of high-power density electronics, but develops design guidelines for cooling of electronic components through the use of novel coatings.

FIG. 6A is a graph illustrating the thermal resistance (R) of air cooling as a function of the convection heat transfer coefficient (h) and thickness ($t_p$) according to an embodiment. Prior to testing the immersion cooling approach, we compared forced air cooling with immersion cooling. As a rough baseline, we consider a standard geometry of a finned heat sink to quantify the overall junction-to-coolant thermal resistance. The finned heat sink has 10 square fins (5 cm×5 cm face area) that are 2 mm thick, spaced 3 mm apart, and cover the entire PCB area (5 cm×5 cm). Underneath the heat sink resides a gap pad (1 mm thick) made of a rubber-like material with a thermal conductivity of $k_{pad}$=17 W/(m K). The gap pad and heat sink sit on top of the PCB and air is blown toward the heat sink, with a convection coefficient h on the exterior surfaces. The heat sink is assumed to be made of copper $k_{Cu}$=385 W/(m K). The fin resistance associated with this configuration is calculated and the total thermal resistance of the forced air cooling strategy is illustrated in FIG. 6A.

FIG. 6B is a graph illustrating immersion cooling in a dielectric fluid (Novec 7300, 3 M) and in deionized water with a Parylene C coating for electrical insulation, as a function of the Parylene C thickness ($t_p$), according to an embodiment. For a comparison to immersion cooling, we assume the same PCB is coated with an insulating layer of Parylene C ($k_p$=0.1 W/(m² K)), and immersed in water. Water pool boiling is assumed to have h=100 kW/(m² K) with pool boiling in dielectric fluids typically being one order of magnitude lower. The total thermal resistance of dielectric immersion cooling is composed of only the pool boiling convective resistance, as an electrically insulating coating is not needed in this case. The heat transfer enhancement factor (inverse of thermal resistance ratio) of water pool boiling with respect to forced convection air cooling (h=250 W/(m² K)) and dielectric pool boiling as a function of the Parylene C thickness ($t_p$), as presented in FIG. 6C.

The results of FIG. 6C highlight the importance of minimizing the Parylene C insulation thickness in order to maximize the heat transfer enhancement of boiling. The added parasitic resistance of even ultra-thin layers (≈1 to 25 μm) is large enough to affect the overall heat transfer given the ultra-high heat transfer coefficients (≈100 kW/(m² K)) encountered in pool and flow boiling.

FIG. 6D is a bar graph illustrating critical heat flux (CHF) as obtained from the Zuber correlation for water, a 50-50 by volume water-ethylene glycol mix, and Novec 7300 dielectric fluid, according to various embodiments. The potential enhancement here is also reflected in the relatively high critical heat flux of water.

FIG. 7A is a photograph of an experimental setup used to conduct immersion cooling tests, according to some embodiments. The setup included a (1) glass immersion tank, (2) PCB, (3) support for the PCB to hold it vertically in place, (4) thermocouple reader, (5) power supply to power the GaN devices, and (6) a digital multimeter to characterize losses. This setup was used for characterizing immersion cooling performance of the transistors, which were soldered to the PCB. The PCB was immersed in the glass tank (20 cm×40 cm×25 cm) that held the immersion fluid. The size of the immersion bath was chosen to be much larger than the component heat sources in order to ensure a large thermal mass of the immersion fluid, ensuring consistent fluid temperatures during experiments. The PCB was held vertically with a clamp that was attached to an aluminum rod support structure with screw clamps, giving freedom of operation in the vertical plane and in the horizontal inclination. The support structure itself was stabilized through the base weight and could easily be repositioned.

An HP6033A power supply was used to apply voltage to the transistors that operated in diode mode (gate-source shorted, $V_{SD}$=0). The diode regime enabled us to dissipate sufficient heat to induce pool boiling of the immersion fluid, as opposed to the pure conduction mode ($V_{GS}$=5 V, $i_{DS}$>0) that is characterized by low thermal losses as the on-state resistance varies from $R_{ds,ON}$=10 mΩ (EPC 2034) to 50 mΩ (GS66508B, GS66508T). The voltage drop across the drain and source was measured via a Keysight 34465A digital multimeter, through Kelvin connections that provided direct access to the drain and source eliminating the error due to voltage drop across the connecting wires.

Standard FR-4 PCBs were used, with all exposed copper coated with gold to prevent oxidation. The FR-4 layer was 1.6 mm thick, sandwiched between two 71.12 μm thick copper layers (2 oz. Cu). The copper leads on the PCB were made thin (≈1 mm wide) near the transistors to constrain the heat in this region. Further away from the components where the PCB was not immersed, the leads became wider (≈5 mm wide) in order to prevent them from overheating and decreasing the thermal resistance simultaneously. For the bottom-cooled GaN Systems devices, open-plated through-hole vias were added to drive heat to the thermal pads created on the bottom copper layer. The vias were spaced between 0.60 and 0.70 mm (e.g., 0.64 mm) apart, both vertically and horizontally, with a diameter equal to between 0.25 mm and 0.35 mm (e.g., 0.3 mm), to prevent solder wicking through the vias. Thus, the high-thermal electronics can include a bottom-cooled power transistor device having at least one thermal pad disposed on a back of a PCB opposite from the bottom-cooled power transistor device. This PCB includes through-hole vias between the bottom-cooled power transistor and the thermal pad, where the nano-engineered coating is also deposited on the thermal pad and generally on the electronics on both sides of the PCB.

FIG. 7B is an photograph of a high-magnification image of the transistors residing on the PCB showing the GaN systems top cooled (GST), GaN systems bottom cooled (GSB), and EPC 2034 (EPC) devices, according to some embodiments. On the surface of the transistor, we mounted a PFA insulated K type thermocouple with a diameter of 80 μm and fixed the thermocouple via a premixed epoxy paste (Duralco 128) that was left 24 hours to cure at room temperature. The epoxy was deposited to form a small droplet (<1 mm×1 mm) in order to minimize the error on the temperature measurement while providing sufficient adhesion for the thermocouple. However, the temperature error could still be large for high heat fluxes, as depicted in some of our error bars after error propagation analysis. The thermocouples were mounted on top of the conformal Parylene C coating, not between the device and the coating. FIGS. 7C, 7D, 7E are images illustrating thermocouples (TC) attached to the surface of the transistors via epoxy and which illustrate the dimensions and footprints of the GST, EPC and GSB, and GaN devices, respectively.

As mentioned, three types of transistors were used in the experiments, namely GST, GSB, and EPC. The EPC2034 device is a chip-scale packaged (i.e., passivated die) top-cooled transistor with solder balls on its back (PCB side) that are used for soldering purposes. The EPC2034 is rated for a drain-source voltage $V_{DS}$=200 V, drain current $i_D$=48 A, with an ON state resistance $R_{DS,ON}$=10 mΩ. The EPC2034 is used for high frequency DC-DC conversion, motor drive, industrial automation, class-D audio and other applications. On the other hand, the two transistors provided by GaN Systems, GS66508B (bottom-cooled) and GS66508T (top cooled), contain discrete GaN power devices embedded within a laminate construction package with external pads that are soldered on the surface of the PCB. For the bottom-cooled device, thermal vias (spacing and diameter) were added to the footprint in order to route the heat generated to the thermal pad located on the back of the board. In the case of top-cooled transistors, heat is dissipated to the fluid through the top thermal pads that are added by the manufacturer. Both transistors are rated for $V_{DS}$=650 V, drain current $i_D$=30 A, with $R_{DS,ON}$=50 mΩ, with applications in high efficiency and high power density power conversion (AC-DC and DC-DC), uninterruptable power supplies, and other applications.

TABLE 2

| | T = 25° C. | | | |
|---|---|---|---|---|
| Property | Novec 72DE | Novec 7300 | Water | 50/50 WEG |
| $T_b$ | — | — | — | — |
| $c_p$[kJ/(kg,K)] | ≈1.1 | 1.14 | 4.173 | 3.412 |
| $h_{fg}$[kJ/kg] | ≈235 | 92 | 2438 | ≈1500 |
| $\rho_l$[kg/m³] | 1280 | 1645 | 997 | 1079 |
| $\rho_v$[kg/m³] | 2.19 | 1.06 | 0.025 | ≈0.02 |
| k[W/(m·K)] | ≈0.06 | 0.063 | 0.6 | ≈0.37 |
| σ[mN/m] | 19 | 14.15 | 72 | 57 |
| μ × 10⁶ [Pa·s] | 450 | 1000 | 855 | 2800 |
| Pr | ≈8.25 | 18.78 | 5.95 | ≈25.8 |
| β × 10⁶ [K⁻¹] | ≈1300 | 1300 | 276 | 210 |

TABLE 3

| | T = $T_b$ (boiling temperature) | | | |
|---|---|---|---|---|
| Property | Novec 72DE | Novec 7300 | Water | 50/50 WEG |
| $T_b$ | 43 | 98 | 100 | 107.3 |
| $c_p$[kJ/(kg,K)] | ≈1.1 | 1.14 | 4.217 | 3.65 |
| $h_{fg}$[kJ/kg] | 217.6 | ≈84.2 | 2257 | ≈1380 |
| $\rho_l$[kg/m³] | ≈1143 | 1467 | 957.8 | 1030 |
| $\rho_v$[kg/m³] | ≈27.38 | 13.2 | 0.6 | ≈0.02 |
| k[W/(m·K)] | ≈0.06 | 0.063 | 0.68 | ≈0.4 |
| σ[mN/m] | ≈11.65 | 8.64 | 58.9 | 45 |
| μ × 10⁶ [Pa·s] | ≈190.7 | 423 | 279 | 700 |
| Pr | ≈3.37 | 7.65 | 1.76 | 6.38 |
| β × 10⁶ [K⁻¹] | — | — | — | — |

Two dielectric fluids (3M Novec 72DE, 3M Novec 7300), tap water, and a mixture of water and ethylene glycol 50%-50% by volume (WEG), were used as immersion fluids during testing. The properties of the fluids are shown in Table 2 at a temperature of 25° C. and in Table 3 at a boiling temperature ($T_b$). Tables 2 and 3 thus list thermos-physical properties of the immersion fluids at ambient temperature and saturation temperature at atmospheric pressure. Errors for each reported value are within ±10%.

For water and WEG, a few droplets of commercial non-ionic surfactant (Plex Mate) were added to the immersion bath to eliminate the adhesion of pre-dissolved air on the transistor as the temperature increases and the solubility of air decreases in the working fluid. The temperature of the immersion bath was held at room temperature (22° C.±3° C.). The resulting boiling curves are hence obtained for the subcooled regime and would present a larger heat dissipation than would have been observed in saturated boiling for the different fluids. Our experiments lasted at most 5 hours per device.

Prior to testing with water and WEG, the boards were coated with a thin (~1-25 μm) coating of a dielectric (Parylene C, $E_s$=78 V/m, $k_p$=0.1 W/(m K)) via chemical vapor deposition (CDV, Specialty Coating Systems Corporation). The conformal coating was tested in tap water prior to experimentation for current leakage through the PCB. The gate was connected to the source without any activation voltage, and the voltage between drain and source was increased up to 200 V without any observed current or electrolysis of the water.

Figure 8:
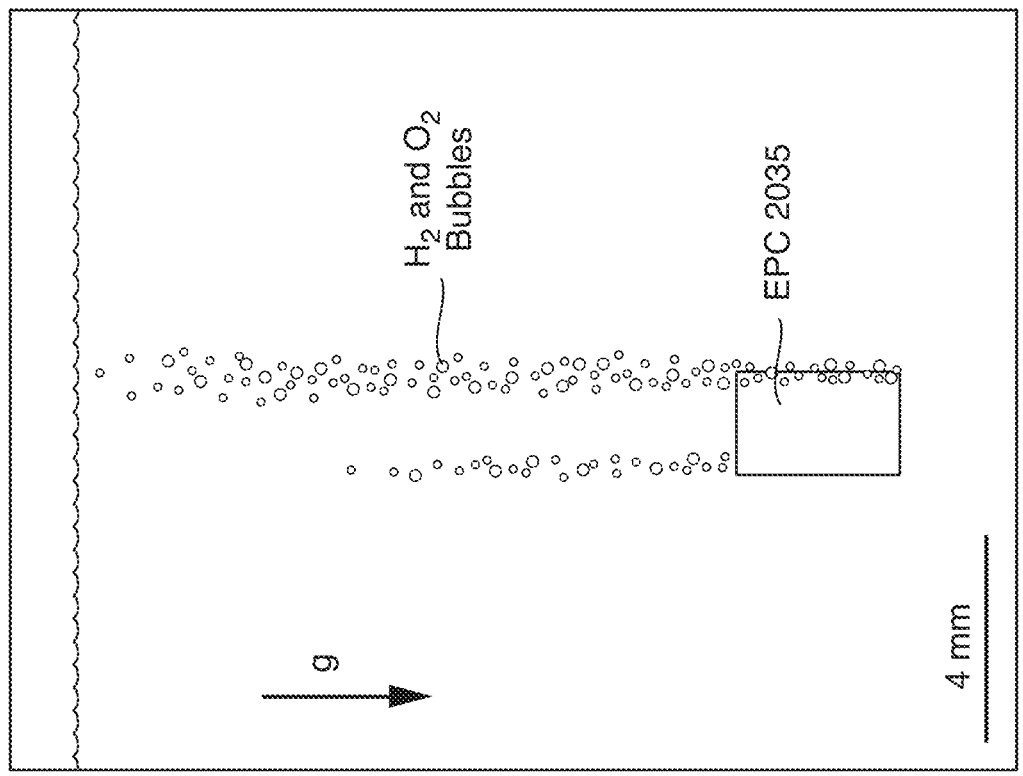
FIG. 8 is an SEM image illustrating a front view of electrolysis of tap water for an EPC 2034 transistor in reverse diode mode with no Parylene C coating, according to an embodiment.

FIG. 8 is an SEM image illustrating a front view of electrolysis of tap water for an EPC 2034 transistor in reverse diode mode with no Parylene C coating, according to an embodiment. Without any coating, bubbles were observed to form and rise from the transistors due to electrolysis, demonstrating that the coating inhibited electrolysis.

Experiments were conducted for two dielectric fluids (Novec 72DE and Novec 7300) as well as for water and WEG mixture for three different thicknesses of Parylene C ($t_p$=1±0.1 μm, 5±0.2 μm and 25±0.2 μm). We plot the power dissipated per transistor as a function of the temperature difference between the surface temperature of the transistor and the ambient fluid. In our experiments, the ambient temperature of the immersion fluid was always room temperature, and ranged from 22 to 25° C. during the 12 months of testing. In addition, we compared the performance of two different topologies for top-cooled transistors (EPC 2034 and GST).

Figure 9A:
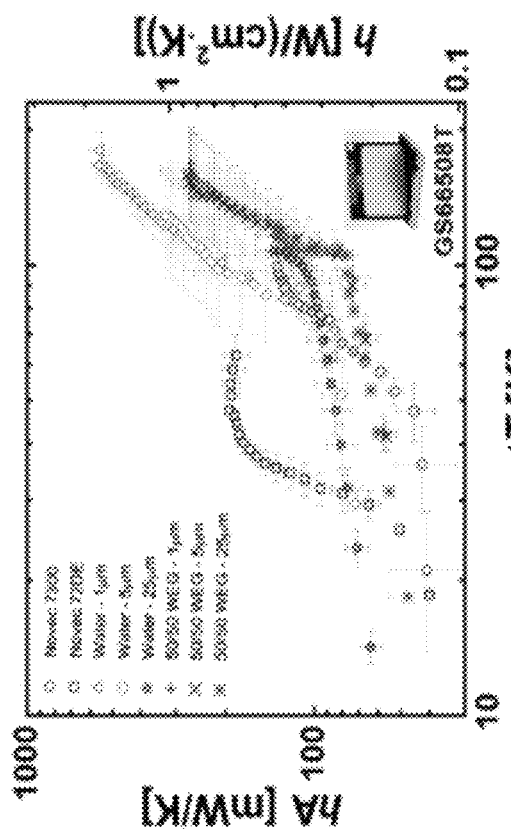
FIG. 9A is a graph illustrating power dissipated per transistor (EPC2034) as a function of the temperature difference between the top surface of the Parylene C coated transistor and the ambient fluid temperature ($\Delta T$) for a GST device, according to various fluid embodiments.

FIG. 9A is a graph illustrating power dissipated per transistor (EPC2034) as a function of the temperature difference between the top surface of the Parylene C coated transistor and the ambient fluid temperature (ΔT) for a GST device, according to various fluid embodiments. The right axis shows power dissipated per device footprint area (A=12.5 mm²), q". The power to the transistor was increased until the device failed. The curves depict the regime of single-phase natural convection as well as the pool boiling regime.

For the dielectric fluids, CHF was reached, which led to device failure due to overheating. The power dissipated did not exceed 14 W and CHF was achieved at (ΔT≈60° C. or GaN surface temperature $T_s$≈80° C. ($T_{amb}$≈22° C.) for Novec 72DE ($T_b$=43° C.) and at $T_s$=120° C. for Novec 7300 ($T_{sb}$=98° C.)

For water and WEG, the device failure occurred in the nucleate pool boiling regime due to the junction temperature exceeding its rated value of 150° C. Theoretically, the pool boiling curve should not vary for the different Parylene C thicknesses for a given fluid, since the heat flow would not change for a given heat transfer coefficient and the same temperature difference between the surface of the transistor and the ambient fluid temperature. This is in good agreement with the experimental curves showing little variation within the same fluid, except that the maximum power obtained can vary greatly for varying Parylene C thickness, which relates to the overall resistance (including the Parylene C thermal resistance). The maximum power dissipated per device is shown in Table 4 for the different curves plotted in FIG. 9A.

TABLE 4

| | | | 50/50 WEG | | | Water | | |
|---|---|---|---|---|---|---|---|---|
| Device | 72DE $t_p = 0$ | 7300 $t_p = 0$ | $t_p = 25$ μm | $t_p = 5$ μm | $t_p = 1$ μm | $t_p = 25$ μm | $t_p = 5$ μm | $t_p = 1$ μm |
| EPC2034(A = 12 mm²) | 90 | 111 | 103 | 298 | 452 | 108 | 299 | 562 |
| GST(A = 31.5 mm²) | 37 | 42 | 49 | 124 | 314 | 51 | 136 | 139 |

Maximum Power Dissipated per Footprint Area [W/cm²]

Figure 9B:
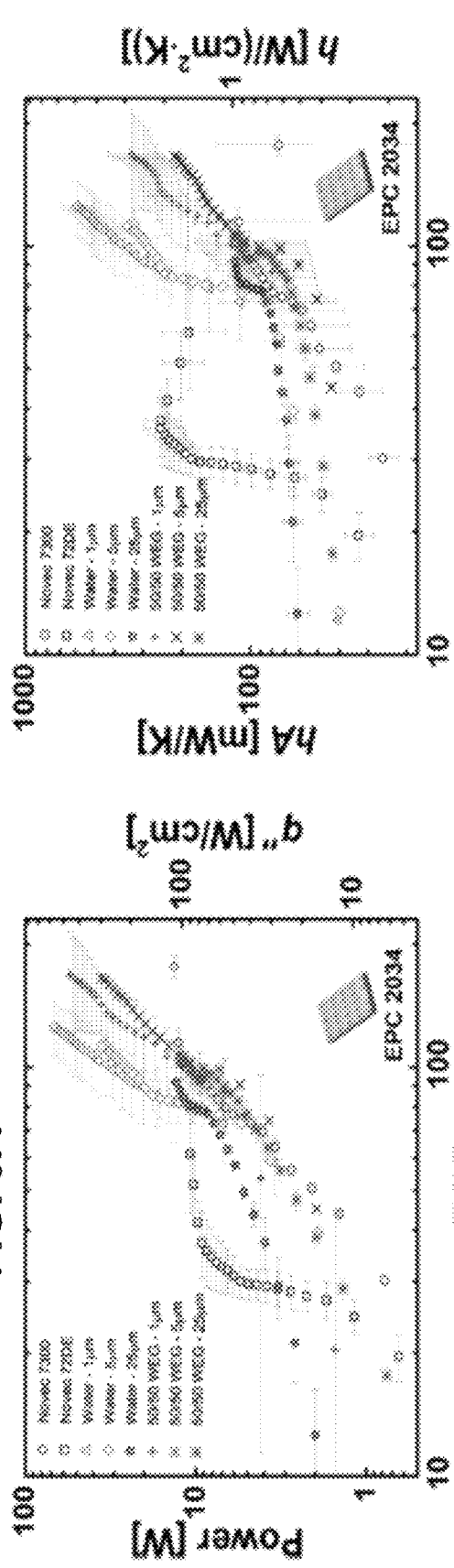
FIG. 9B is a graph illustrating overall area-multiplied conductance (UA) as a function of $\Delta T$ for a GST, according to various fluid embodiments.

FIG. 9B is a graph illustrating overall area-multiplied conductance (UA) as a function of ΔT for a GST, according to various fluid embodiments. The heat transfer coefficient was difficult to determine with high fidelity since the area through which the heat was being dissipated was greater than the device footprint area due to heat spreading in the PCB. For that reason, we plot the area-multiplied heat transfer coefficient (hA) as a function of ΔT, and a corresponding heat transfer coefficient (h) based on the footprint area on the right axis. The measured heat transfer coefficients are summarized in Table 5.

TABLE 5

Heat Transfer Coefficient, h [kW/(m² · K)]

| Fluid | Natural convection | Nucleate Pool Boiling |
|---|---|---|
| Novec 72DE | 2 ± 0.34 to 5.4 ± 0.54 | 5.4 ± 0.54 to 20.8 ± 4.2 |
| Novec 7300 | 1.9 ± 0.05 to 4.2 ± 1.17 | 4.2 ± 1.17 to 9.7 ± 4.9 |
| 50/50 WEG | 2.5 ± 0.11 to 7 ± 0.36 | 7.0 ± 0.36 to 27.9 ± 7.83 |
| Water | 3.3 ± 0.25 to 9.2 ± 2.08 | 9.2 ± 2.08 to 49.2 ± 8.16 |

Figure 9C:
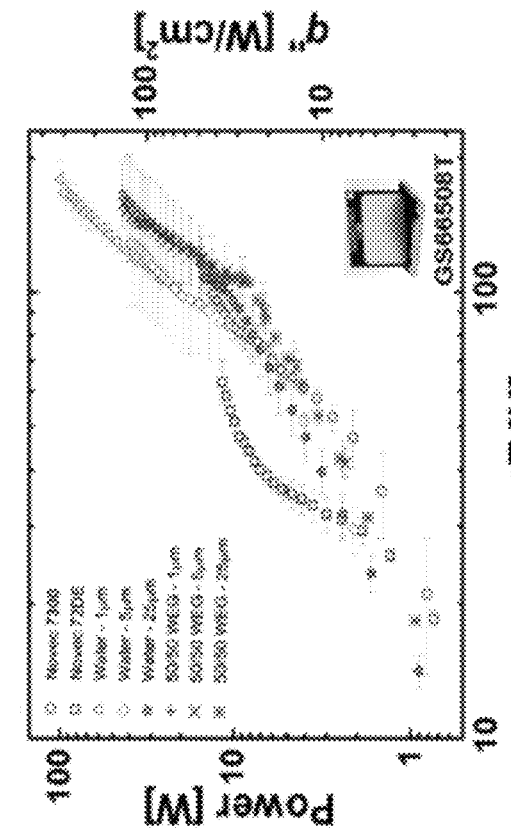
FIG. 9C is a graph illustrating power dissipated as a function of $\Delta T$ for a GST device, according to various fluid embodiments.
Figure 9D:
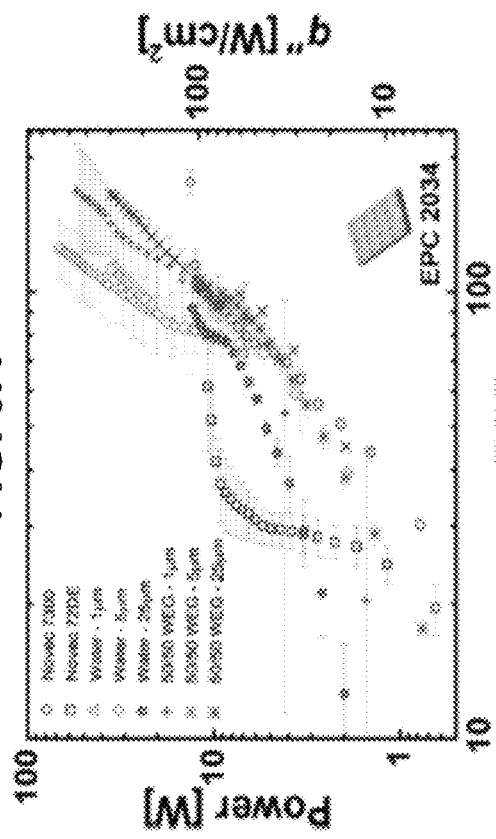
FIG. 9D is a graph illustrating overall UA as a function of $\Delta T$ for a GST device, according to various fluid embodiments.

Table 5 includes experimental heat transfer coefficient (based on the EPC2034 footprint area of A=12 mm²) for natural convection and nucleate pool boiling in the immersion fluids considered. Error bounds were obtained via propagation of error. FIG. 9C is a graph illustrating power dissipated as a function of ΔT for a GST device, according to various fluid embodiments. FIG. 9D is a graph illustrating overall UA as a function of ΔT for a GST device, according to various fluid embodiments.

The error in the measured temperature difference was obtained by propagating the error associated with experimental measurement of at least two different boards (2-5 experimental measurements per curve) along with the error of the thermocouple (±1° C.). The error in the measured heat dissipation is minimal and not plotted in the results, as the voltage $V_{DS}$ was measured with Kelvin connections and did not include any losses from the wires. The error in the power dissipated was, on average, less than ±0.5 W. While the power error bars were insignificant, some temperature error bars observed were relatively large (±50° C.). This was due to the variation (<0.5 mm) in the thickness of the epoxy ($k_e$=2.88 W/(m·K)) used to attach the thermocouple to the coated GaN device (See Table 6).

TABLE 6

Heat Transfer Coefficient, h [kW/(m² K)]

| Fluid | Natural convection | Nucleate Pool Boiling |
|---|---|---|
| Novec 72DE | 1.27 ± 0.06 to 2.4 ± 0.21 | 2.4 ± 0.21 to 6.2 ± 0.44 |
| Novec 7300 | 1 ± 0.19 to 2 ± 0.086 | 2 ± 0.086 to 4.2 ± 0.11 |

TABLE 6-continued

Heat Transfer Coefficient, h [kW/(m² K)]

| Fluid | Natural convection | Nucleate Pool Boiling |
|---|---|---|
| 50/50 WEG | 1.5 ± 0.22 to 2.3 ± 0.29 | 2.3 ± 0.29 to 8.6 ± 2.57 |
| Water | 2.1 ± 0.32 to 3.2 ± 0.46 | 3.2 ± 0.46 to 17.8 ± 1.37 |

Figure 10:
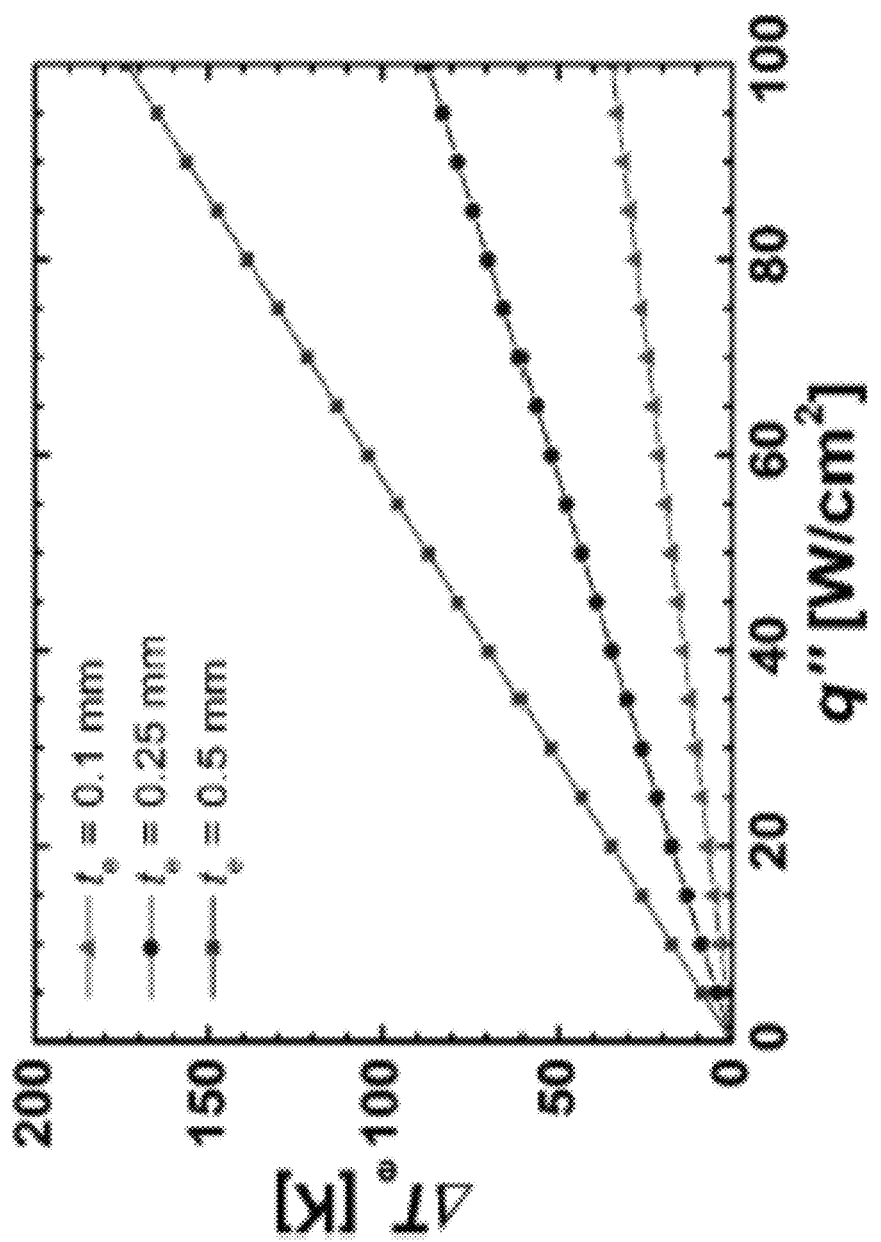
FIG. 10 is a graph illustrating temperature drop across the epoxy layer ($\Delta Te$) used to mount the thermocouple on top of the Parylene C coated devices as a function of heat flux (q") for different epoxy thicknesses ($t_e$), according to various embodiments.

FIG. 10 is a graph illustrating temperature drop across the epoxy layer (ΔTe) used to mount the thermocouple on top of the Parylene C coated devices as a function of heat flux (q") for different epoxy thicknesses ($t_e$), according to various embodiments. A one-dimensional linear thermal resistance model was assumed for the estimation of the temperature drop (ΔT ¼ q"$t_e$/$k_e$, where $k_e$=2.88 W/(m K)). FIG. 10 shows the temperature drop across the epoxy for a heat flux ranging from 1 to 100 W/cm² (which is roughly the critical heat flux for water that was not reached in the experiments), when the epoxy thickness $t_e$ takes on values of 0.1 mm, 0.25 mm, and 0.5 mm. The estimation relies on the approximation of a one-dimensional linear thermal resistance model of heat flow through the epoxy. The maximum temperature drop ranges from 35° C. for $t_e$=0.1 mm to 170° C. for $t_e$=0.5 mm, which explains the error bars observed, and is a limitation of the temperature measurement technique employed.

In an attempt to minimize error of the device measurement, we attempted to calibrate the temperature dependence of GaN device electrical thermal resistance, and then use the device as a thermometer, in situ, during experiments. Briefly, the GaN device was placed in a constant temperature furnace (Lindberg Blue M BOX 1200C 208/240V) and we introduced very low currents (1 mA) through the transistor to be able to measure the resistance (by detecting voltage and current) at a given furnace temperature. A curve depicting the measured resistance versus temperature was obtained. However, the device calibration method was not used due to the inability to obtain repeatable experimental results for PCBs having identical designs and operating in identical immersion conditions.

In order to compare the relative performance of the working fluids in both the single phase (natural convection) regime and the two-phase (pool boiling) regime with existing literature, we referred to the well-known Churchill correlation for laminar natural convection (Equations (1) and (2)) and the Rohsenow model for pool boiling (Equation (3)):

$$Nu = \frac{hL}{k} = 0.68 + \frac{0.67 Ra^{\frac{1}{4}}}{\left[1 + \left(\frac{0.492}{Pr}\right)^{\frac{9}{16}}\right]^{4/9}}, Ra < 10^9, \quad (1)$$

$$Ra = \frac{g\beta(T_s - T_{amb})L^3}{v\alpha}, \qquad (2)$$

$$q'' = \mu h_{fg}\left[\frac{g(\rho_1 - \rho_v)}{\sigma}\right]^{\frac{1}{2}}\left(\frac{1}{C_{sf}}\right)^{1/2} Pr^{-(s/r)}\left[\frac{c_p(T_s - T_{sat})}{h_{fg}}\right]^{1/r}, \qquad (3)$$

where r=0.33, s=1 for water and s=1.7 for other fluids. The surface coefficient $C_{sf}$=0.013 for water, 0.0022 alcohol (water-glycol) and 0.0049 for n-Pentane (dielectric fluids). The characteristic length scale L was taken as the ratio of the footprint area to the foot-print perimeter of the transistor (≈1.4 mm).

Figure 11B:
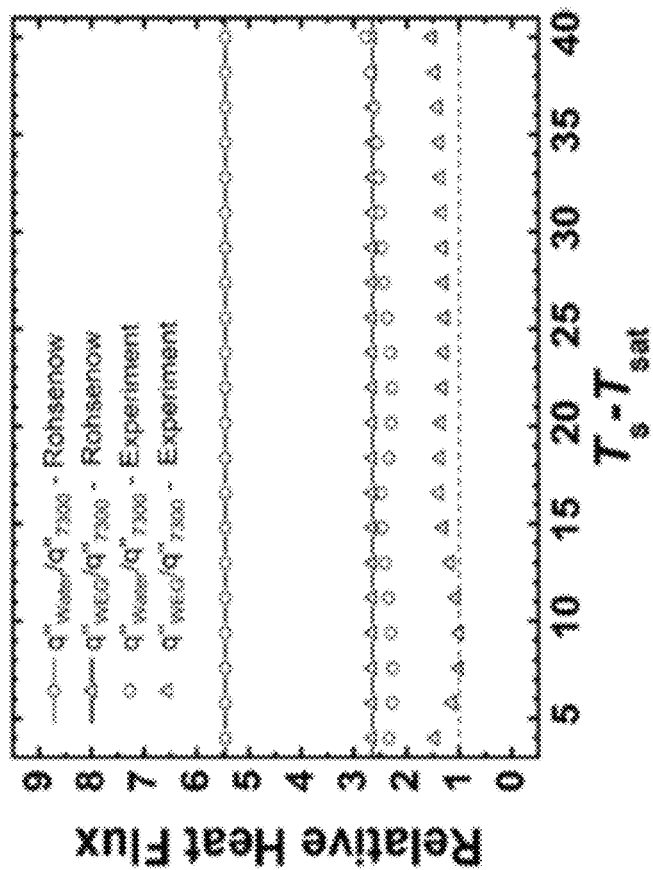
FIG. 11B is a graph of nucleate pool boiling relative heat flux comparison from the current experiment and the Rohsenow model, according to an embodiment.
Figure 11A:
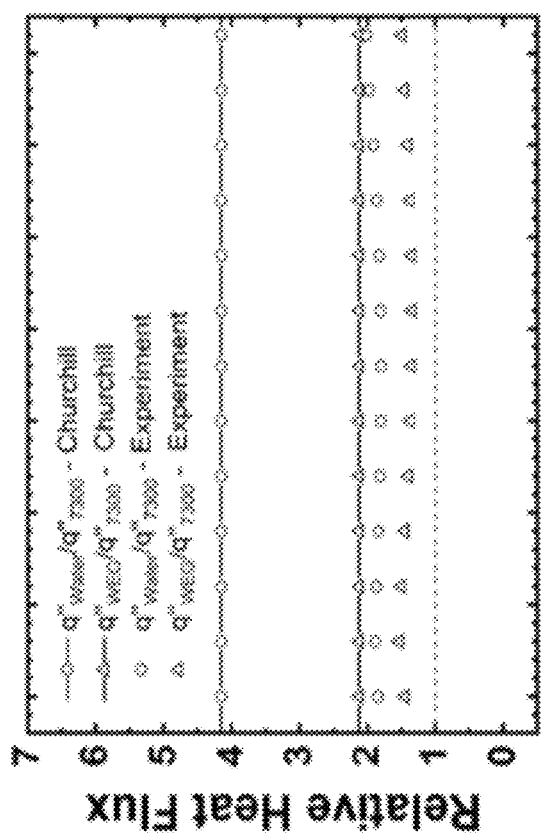
FIG. 11A is a graph of a relative heat flux comparison for several immersion fluids as a function of the temperature difference for natural convection from the current experiment and the Churchill correlation, according to an embodiment.

FIG. 11A is a graph of a relative heat flux comparison for several immersion fluids as a function of the temperature difference for natural convection from the current experiment and the Churchill correlation, according to an embodiment. FIG. 11B is a graph of nucleate pool boiling relative heat flux comparison from the current experiment and the Rohsenow model, according to an embodiment. FIGS. 11A-11B shows that the experimental relative thermal performance of the fluids is qualitatively as expected for both the natural convection and pool boiling regimes. The quantitative discrepancy (2×) for natural convection was due to the area used for heat dissipation, as spreading was not considered in the calculation of the heat transfer coefficient. In addition, the assumption of a one-dimensional heat transfer for the vertical plate leads to an oversimplification of the experiment that depicts a small heat source with two-dimensional spreading to the PCB. As for the pool boiling regime, the Rohsenow model is very sensitive to the surface coefficient $C_{sf}$. The coefficient we utilized was valid for copper, whereas in reality, the contact surface is Parylene C for the water and WEG fluids, and the contact surface is the outer-package of the transistor for the dielectric fluids. Hence, the surface coefficients need to be determined in order to ensure higher accuracy.

In order to further investigate the discrepancy between the experimental results and the correlations used, we performed a three-dimensional (3D) steady-state natural convection simulation with the simulation package Ansys Icepak (v19.0) replicating the same dimensions we have in the experiments.

Figure 12B:
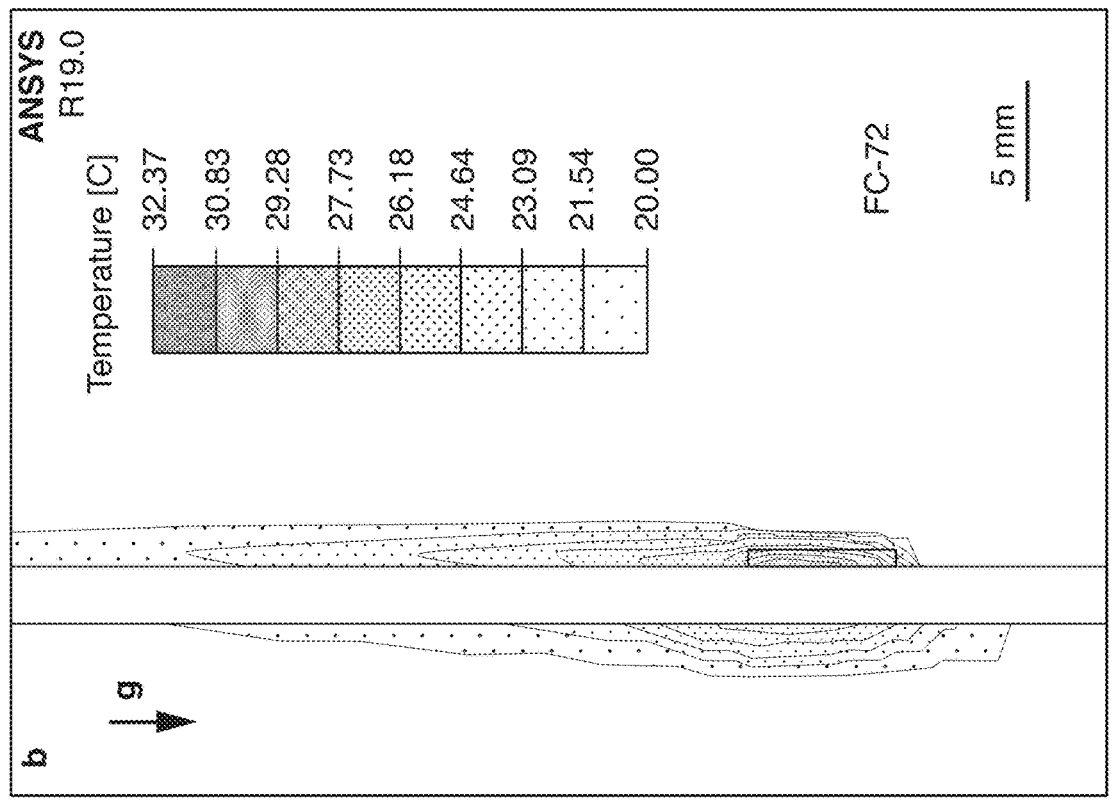
FIG. 12B is a graph of a temperature profile obtained from the 3D steady-state simulation of natural convection due to an immersed heat source releasing 1 W of heat in water FC-72 dielectric fluid, according to an embodiment.
Figure 12A:
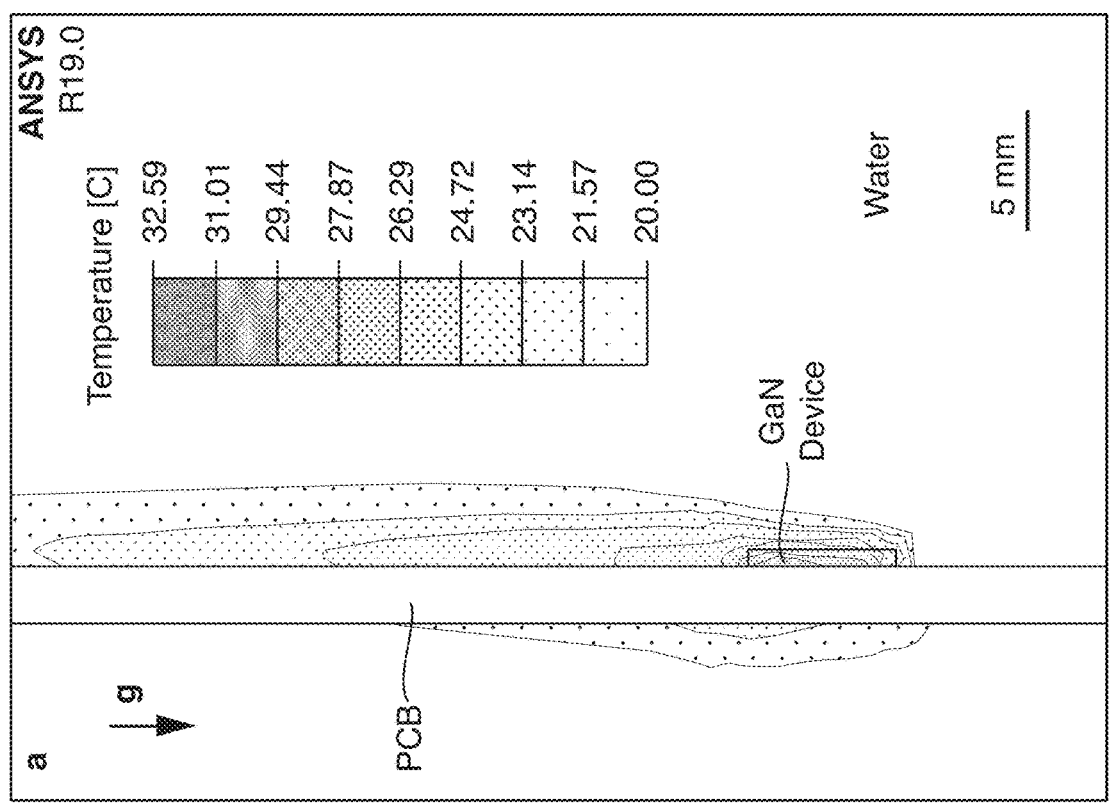
FIG. 12A is a graph of a temperature profile obtained from the 3D steady-state simulation of natural convection due to an immersed heat source releasing 1 W of heat in water, according to an embodiment.

FIG. 12A is a graph of a temperature profile obtained from the 3D steady-state simulation of natural convection due to an immersed heat source releasing 1W of heat in water, according to an embodiment. FIG. 12B is a graph of a temperature profile obtained from the 3D steady-state simulation of natural convection due to an immersed heat source releasing 1 W of heat in water FC-72 dielectric fluid, according to an embodiment. All the computational domain boundaries are thermally insulated except the top face where the temperature is set to 20° C. The maximum and minimum mesh sizes are 2 and 0.4 mm, respectively. Simulations were carried out until the residuals for the continuity, momentum and energy equations fell below 0.01.

More specifically, FIGS. 12A-12B show the temperature distribution for a heat source volumetrically generating 1 W of heat in water (FIG. 12A) and FC-72 dielectric fluid having similar thermos-physical properties as the Novec fluids (FIG. 12B). It is apparent from the higher backside liquid temperature in FC-72 that more heat is dissipated from the back of the board compared to immersion in water. The higher backside dissipation is due to the presence of backside natural convection being more vigorous in FC-72 due to its higher thermal expansion coefficient when compared to immersion in water. The higher backside dissipation is due to the presence of backside natural convection being more vigorous in FC-72 due to its higher thermal expansion coefficient when compared to water (velocity in water 0.001 m/s compared to 0.01 m/s in FC-72). This phenomenon causes the correlations to overestimate the ratio of convective thermal resistances where these models consider only one-sided natural convection from a vertically oriented spot. The high viscosity of the WEG mitigates this effect, reducing the discrepancy between predicted and measured heat transfer coefficients.

Experiments conducted on the EPC top-cooled transistors showed that pool boiling started underneath the device where the solder balls were located. Pool boiling eventually appeared on the top of the device after the power was increased above a certain level. The ability to achieve pool boiling on both the top and bottom sides can be considered as a specific result for top-cooled devices since the thermal resistance from the junction is 9× larger to the board (bottom) than it is to the case (top). The result is not particularly surprising, however, since the bottom thermal resistance included in the datasheet of the devices includes the effect of solder balls. The solder balls account for most of the thermal resistance from the junction to the board (EPC2034 is a bare die). Hence, the bottom temperature of the device is expected to be closer to the junction temperature when compared to the top case temperature, thereby explaining bubble nucleation at the solder balls. To demonstrate that most of the heat was dissipated adjacent to the solder balls, we designed thermal vias from the transistor to the back of the board and obtained similar heat transfer performance to the transistors with no back-vias (FIGS. 13A-13B).

FIG. 13A is a graph of power dissipated as a function of device surface-to-fluid temperature difference (ΔT) for a top cooled EPC2034 transistor having a through-PCB copper via and back gold pad, according to an embodiment. Inset images show a top view photograph of the GaN device front and backside. The GaN face area is A=2.4 mm×4.8 mm. FIG. 13B is a graph of device conductance (UA) as a function of device surface-to-fluid temperature difference (ΔT) for a top cooled EPC2034 transistor having a through-PCB copper via and back gold pad, according to an embodiment. FIGS. 13C, 13D, 13E are side views of SEM time-lapse images showing bubble generation underneath the EPC device and on the top surface, according to some embodiments. Images were taken with a high speed camera (Photron Mini AX200) at a rate of 1000 frames per second.

Figures 14A, 14B:
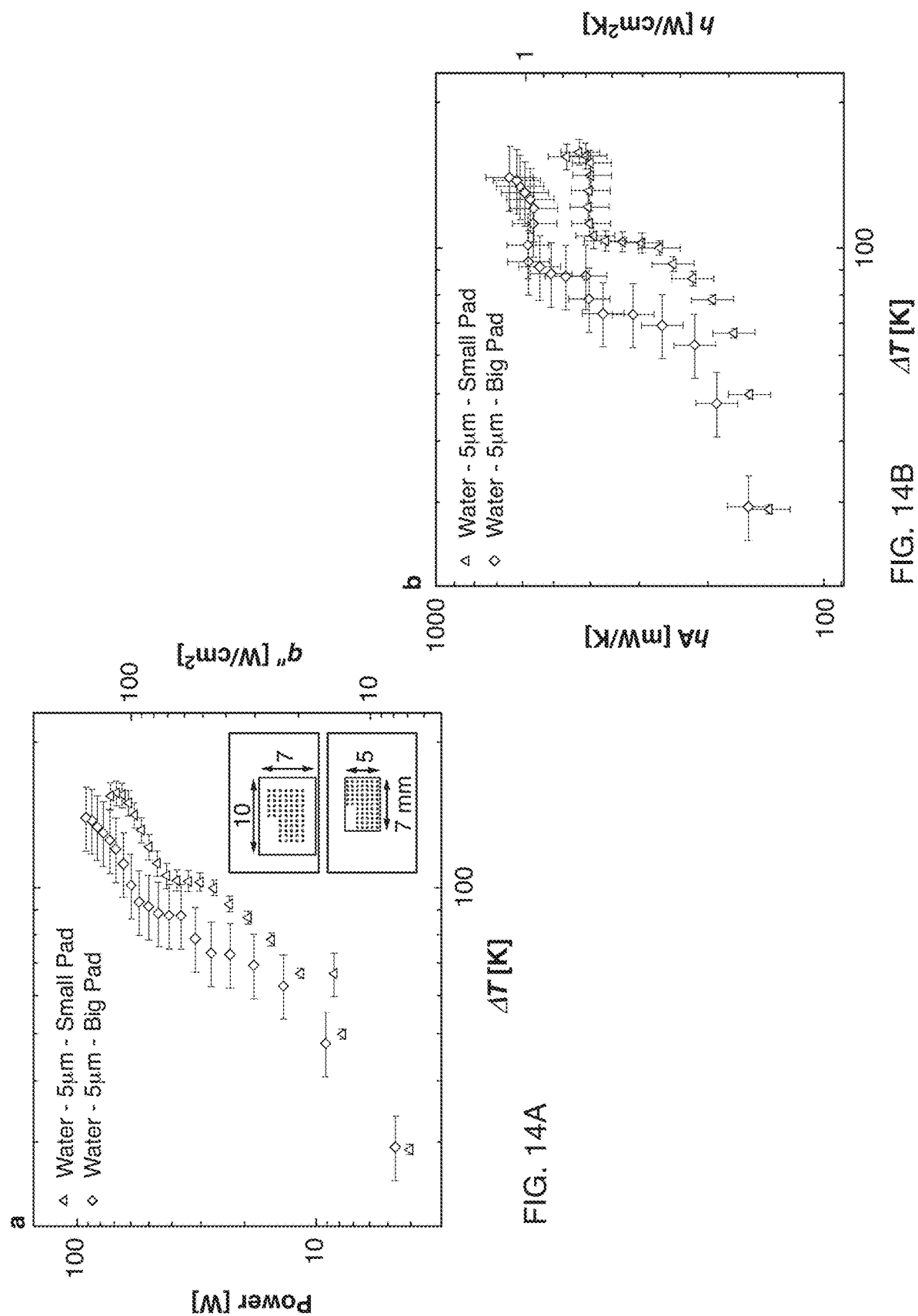
FIG. 14A is a graph illustrating the effect of pad size on the (a) heat dissipation with the bottom cooled GaN transistor (GS66508B), according to some embodiments.
FIG. 14B is a graph illustrating device conductance and heat transfer coefficients with the bottom cooled GaN transistor (GS66508B), according to some embodiments.

FIG. 14A is a graph illustrating the effect of pad size on the (a) heat dissipation with the bottom cooled GaN transistor (GS66508B), according to some embodiments. Shown inset within FIG. 14A are images illustrating the source-connected gold pads on the back of the PCB. The pads were varied in size from 5 mm×7 mm (small pad) to 7 mm×10 mm (big pad). FIG. 14B is a graph illustrating device conductance and heat transfer coefficients with the bottom cooled GaN transistor (GS66508B), according to some embodiments.

To study the effect of the thermal pad area on cooling performance, bottom-cooled transistors were tested. Two sets of boards were prepared for this purpose with bottom thermal pad areas equal to 35 $mm^2$ and 70 $mm^2$ (FIG. 14A, inset). Experiments were performed in water with boards coated with a 5 µm thick conformal coating of Parylene C. Natural convection cooling started at low power levels followed by pool boiling, which happened initially at the bottom thermal pad.

FIG. 14B shows a jump in the convection heat transfer coefficient that was due to the initiation of boiling on the top side of the transistor with increased power. The enhancement in the cooling performance is so substantial that it can keep the temperature of the transistor nearly the same even with a 2× increase in the power level in the case of large pads creating a thermal buffer. The ability to increase power dissipation at a similar temperature difference is due to the formation of new pool boiling nucleation sites on top of the transistor at higher powers, which compensates for the higher heat generation with a higher convection heat transfer coefficient. The heat transfer buffer zone is followed by a plateau in the power dissipated. The plateau is followed by a further increase in power as new nucleation sites are activated.

To verify the scalability of our developed immersion cooling approach with an actual power electronics application, we experimentally tested immersion cooling of a 4-level flying capacitor multi-level (FCML) power converter in water. The FCML converter was coated with a 25 mm thick coating of Parylene C using the same CVD process used in the single switch test PCBs.

Figure 15B:
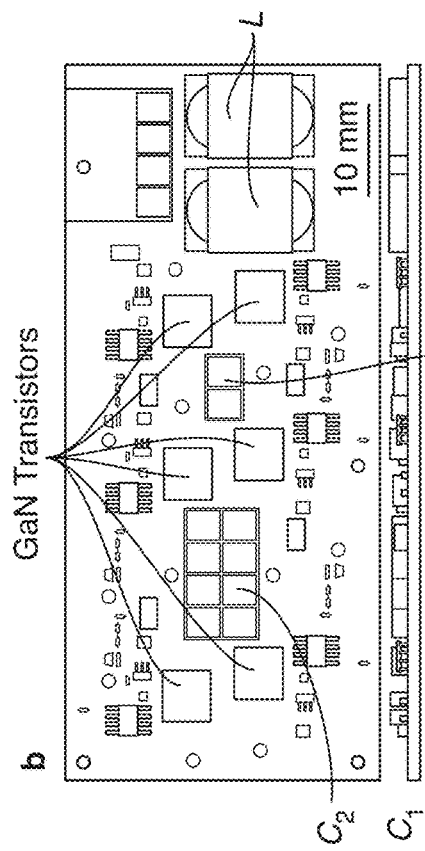
FIG. 15B is an annotated photograph of the top and side view profiles of the experimental prototype FCML power stage, according to an embodiment.
Figure 15D:
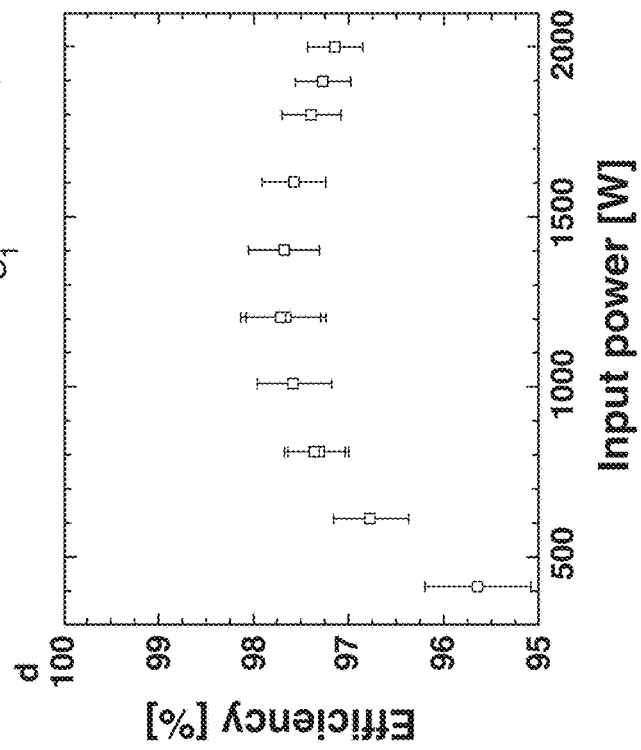
FIG. 15D is a graph of measured conversion efficiency as a function of converter input power, according to an embodiment.
Figure 15A:
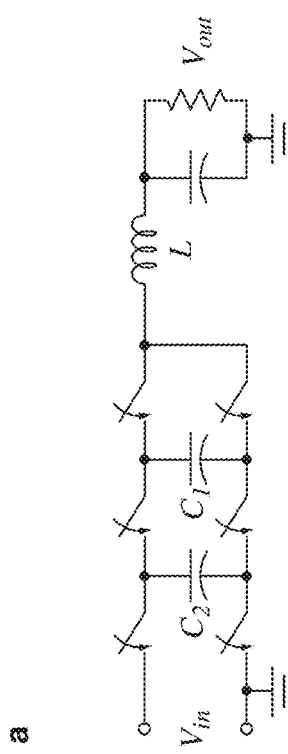
FIG. 15A is a simplified schematic of the 4-level Flying Capacitor Multilevel Converter (FCML), according to an embodiment.

FIG. 15A is a simplified schematic of the 4-level Flying Capacitor Multilevel Converter (FCML), according to an embodiment. FIG. 15B is an annotated photograph of the top and side view profiles of the experimental prototype FCML power stage, according to an embodiment. The experimental 4-level prototype utilizes flying capacitors as energy storage elements, which reduces the switch voltage stress and inductor volt second. These benefits allow for lower volume inductors, which typically dominate the overall volume of the power converter, and a power stage utilizing only surface mount components with a maximum height of 3 mm. With low profile components, CVD is employed to reliably apply the Parylene C coating. In addition, the highest power loss components (six GaN switches and two inductors) are distributed across the prototype and lead to a more distributed thermal load.

Figure 15C:
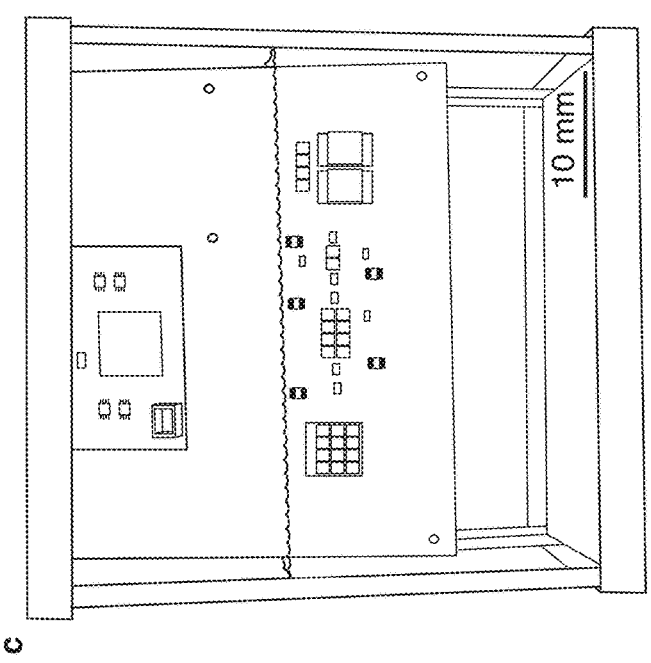
FIG. 15C is a photograph of immersion cooling of the 4-level FCML converter at a power level of 2 kW in deionized water, according to an embodiment.

FIG. 15C is a photograph of immersion cooling of the 4-level FCML converter at a power level of 2 kW in deionized water, according to an embodiment. The converter was coated with a 25 mm thick ($t_p$) coating of Parylene C prior to testing. After immersing the coated converter in deionized water as shown in FIG. 11C, DC-DC conversion with an input voltage of 500 V and a 167 kHz switching frequency produced 56 W of loss from the power components.

FIG. 15D is a graph of measured conversion efficiency as a function of converter input power, according to an embodiment. More specifically, FIG. 15D shows the measured efficiency of the coated power converter operating in deionized water with a 500 V input and 200 V output. Efficiency was measured with a high precision Yokogawa WT3000 power analyzer. A Chroma 63,803 programmable electronic load was used to sweep the load over a wide operating range. Note that the converter was able to reach the peak power (2 kW, current limited by the output inductor) for which it was designed while being immersed in water. The proof-of-concept experiment demonstrated successful operation of the coated converter in water. The tests showed no leakage current during experiments and successful maximum power conversion with an efficiency of 97.5% at a converter average temperature less than 50° C. for a duration of 1 hour.

The proposed use of water and WEG for immersion cooling of coated electronics enables an increased heat flux up to two times larger when compared to dielectric immersion cooling, with no concerns of leakage currents. The superior performance of water and water-glycol mixtures compared to the dielectric fluids for single-phase and two-phase immersion cooling is mainly due to higher thermal conductivity (~10×), and higher latent heat of vaporization (~10×), respectively. As shown in FIG. 12B, the initiation of natural convection occurs earlier for dielectric fluids due to the order of magnitude larger Rayleigh number (dictated by $\beta/\nu\alpha$) for a given temperature difference and length scale. Even with earlier initiation of natural convection, which enhances flow and mixing as well as convective cooling from the backside of the board, water-based immersion fluids outperform dielectric fluids in both regimes for a given operating temperature (FIGS. 11A-11B). Although water-based immersion fluids outperform dielectric fluids, the choice of cooling fluid depends on the required heat flux dissipation and desired operating temperature that ensures maintenance of the junction temperature within a safe operating range. For example, if an EPC 2034 device is designed to operate at power inputs ranging between 1 and 10 W (FIG. 9A), then Novec 72DE would be a more attractive option when compared to water, even though water has a higher CHF. Owing to its lower boiling temperature, the dielectric fluid will be in the boiling regime for the specified power level range, which offers up to a 3× higher heat transfer coefficient when compared to water, which resides in the natural convection regime.

This work provides a comprehensive experimental investigation of water-based immersion cooling for electronics. Immersion of individual GaN transistors was achieved in tap water and WEG (50-50% by volume), and benchmarked against dielectric fluids. The PCB boards were coated with three different thicknesses (1 μm, 5 μm, and 25 μm) of a dielectric coating (Parylene C) prior to immersion in water or WEG. Large heat fluxes (based on foot-print area) dissipations were observed for water (up to 562 W/cm$^2$) and for WEG mixture (452 W/cm$^2$) as compared to dielectric fluids (up to 111 W/cm$^2$), as a result of subcooled pool boiling in a room temperature bath.

Devices failed before the achievement of CHF in both water and WEG mixtures, whereas the CHF was attained for dielectric fluids. We compared the natural convection and pool boiling results with the well-known Churchill and Rohsenow correlations, respectively, showing discrepancies of up to 300%. The difference between theory and experiment show the inability of past models to capture the 3D physics for natural convection and the surface interactions for boiling on a PCB with and without Parylene. In addition, we investigated the onset of pool boiling on the EPC2034 transistor used in power conversion, and discovered that boiling is initiated at the solder balls (PCB side), even though the transistor is rated for top side cooling. Furthermore, we investigated the effect of the thermal pad on the power dissipation of a bottom-cooled transistor (surface mounted on the PCB) and show an increase in heat transfer proportional to the increased area. The work presented here not only develops a novel water-based immersion cooling methodology capable to achieving ultra-high heat dissipation, it opens the door for electro-thermal optimization of electrical layouts for high volumetric and gravimetric power density electronics.

Unless otherwise explained, all technical and scientific terms used herein have the same meaning as commonly understood by one of ordinary skill in the art to which a disclosed disclosure belongs. The singular terms "a," "an," and "the" include plural referents unless context clearly indicates otherwise. Similarly, the word "or" is intended to include "and" unless the context clearly indicates otherwise.

"Comprising" means "including;" hence, "comprising A or B" means "including A" or "including B" or "including A and B." All references cited herein are incorporated by reference.

Whenever a range is given in the specification, for example, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the aspects herein.

The disclosure may be further understood by the foregoing non-limiting examples. All references cited herein are hereby incorporated by reference to the extent not inconsistent with the disclosure herewith. Although the description herein contains many specificities, these should not be construed as limiting the scope of the disclosure but as merely providing illustrations of some of the presently preferred embodiments of the disclosure.

Thus, the above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present embodiments are to be determined by the broadest permissible interpretation of the following claims and their equivalents, and shall not be restricted or limited by the foregoing detailed description. While various embodiments have been described, it will be apparent to those of ordinary skill in the art that many more embodiments and implementations are possible within the scope of the above detailed description. Accordingly, the embodiments are not to be restricted except in light of the attached claims and their equivalents, now presented or presented in a subsequent application claiming priority to this application.

What is claimed is:

1. A method comprising:
    coating, via chemical vapor deposition, one or more power electronic components disposed on a printed circuit board (PCB) with an electrical insulation coating of between two to 25 microns in thickness, the electrical insulation coating covering an outside and top portion of the one or more power electronic components relative to the PCB;
    depositing, on the electrical insulation coating, a nano-layer comprising a porous metal-based nano-structure; and
    after the coating and the depositing, immersing the PCB in a water-based fluid to cool the one or more power electronic components while the one or more power electronic components are powered on and from the outside and top portion of the one or more power electronic components.

2. The method of claim 1, wherein the electrical insulation coating comprises a Parylene-based compound.

3. The method of claim 1, wherein the porous metal-based nano-structure comprises one of copper or copper oxide.

4. The method of claim 1, wherein the water-based fluid comprises one of deionized water or a mixture of water and ethylene glycol.

5. The method of claim 1, further comprising adding, to the water-based fluid, a non-ionic surfactant.

6. The method of claim 1, wherein the depositing comprises performing cathodic deposition of the porous metal-based nano-structure, wherein the nano-layer is a super-hydrophilic nucleating coating.

7. The method of claim 1, wherein the one or more power electronic components include a bottom-cooled power transistor device having at least one thermal pad disposed on a back of the PCB opposite from the bottom-cooled power transistor device, the method further comprising:
    forming through-hole vias within the PCB to drive heat from the bottom-cooled power transistor device to the at least one thermal pad; and
    wherein the coating and depositing are performed on both sides of the PCB.

8. The method of claim 1, wherein the immersing the PCB in the water-based fluid comprises one of immersion that relies on passive return of condensed water and immersion performed via injected fluid from a central cooling loop.

9. The method of claim 1, wherein coating the one or more power electronic components with electrical insulation coating includes coating the PCB with the electrical insulation coating.

* * * * *